US008451175B2

(12) United States Patent
Gummalla et al.

(10) Patent No.: US 8,451,175 B2
(45) Date of Patent: May 28, 2013

(54) ADVANCED ACTIVE METAMATERIAL ANTENNA SYSTEMS

(75) Inventors: Ajay Gummalla, San Diego, CA (US); Cheng-Jung Lee, San Diego, CA (US); Alexandre Dupuy, San Diego, CA (US); Maha Achour, San Diego, CA (US)

(73) Assignee: Tyco Electronics Services GmbH (CH)

( * ) Notice: Subject to any disclaimer, the term of this patent is extended or adjusted under 35 U.S.C. 154(b) by 1115 days.

(21) Appl. No.: 12/400,525

(22) Filed: Mar. 9, 2009

(65) Prior Publication Data

US 2009/0245146 A1 Oct. 1, 2009
US 2010/0110943 A2 May 6, 2010

Related U.S. Application Data

(60) Provisional application No. 61/039,407, filed on Mar. 25, 2008.

(51) Int. Cl.
*H01Q 1/24* (2006.01)
*H03H 7/46* (2006.01)

(52) U.S. Cl.
USPC .................................... 343/700 MS; 333/110

(58) Field of Classification Search
USPC ... 343/700 MS, 702, 749, 846, 909; 333/110, 333/117
See application file for complete search history.

(56) References Cited

U.S. PATENT DOCUMENTS

| | | | | |
|---|---|---|---|---|
| 6,859,114 | B2 | 2/2005 | Eleftheriades et al. | |
| 7,330,090 | B2 | 2/2008 | Itoh et al. | |
| 7,391,288 | B1 | 6/2008 | Itoh et al. | |
| 7,446,712 | B2 | 11/2008 | Itoh et al. | |
| 7,482,893 | B2 | 1/2009 | Itoh et al. | |
| 7,508,283 | B2 | 3/2009 | Itoh et al. | |
| 7,623,083 | B2 * | 11/2009 | Chung | 343/767 |
| 7,741,933 | B2 * | 6/2010 | Duwel et al. | 333/187 |
| 8,222,975 | B2 * | 7/2012 | Ishizaki et al. | 333/219 |
| 8,334,733 | B2 * | 12/2012 | Tamura et al. | 333/168 |
| 2005/0253667 | A1 | 11/2005 | Itoh et al. | |
| 2008/0001684 | A1 | 1/2008 | Itoh et al. | |
| 2008/0204327 | A1 | 8/2008 | Lee et al. | |

OTHER PUBLICATIONS

Casares-Miranda, F.P., et al., "High-Gain Active Composite Right/Left-Handed Leaky-Wave Antenna," *IEEE Transactions on Antennas and Propagation*, 54(8):2292-2300, Aug. 2006.

Lai, A., et al., "Composite Right/Left-Handed Transmission Line Metamaterials," *IEEE Microwave Magazine*, 5(3):34-50, Sep. 2004.

Mata-Contreras, J., et al., "Distributed Mixers with Composite Right/Left-Handed Transmission Lines," *International Workshop on Integrated Nonlinear Microwave and Millimeter-Wave Circuits*, pp. 98-101, Jan. 2006.

International Search Report and Written Opinion dated Jun. 29, 2009 for International Application No. PCT/US2009/036584, filed Mar. 9, 2009 (7 pages).

Caloz and Itoh, *Electromagnetic Metamaterials: Transmission Line Theory and Microwave Applications*, John Wiley & Sons (2006).

Itoh, T., "Invited Paper: Prospects for Metamaterials," *Electronics Letters*, 40(16):972-973, Aug. 2004.

(Continued)

*Primary Examiner* — Huedung Mancuso

(57) ABSTRACT

Techniques, antenna systems and apparatus based on composite right and left handed (CRLH) metamaterial (MTM) structures to couple CRLH MTM circuits to transistors to amplify signals in wireless RF receivers and transmitters.

44 Claims, 25 Drawing Sheets

OTHER PUBLICATIONS

Lai, A., et al., "Infinite Wavelength Resonant Antennas with Monopolar Radiation Pattern Based on Periodic Structures," *IEEE Transactions on Antennas and Propagation*, 55(3):868-876, Mar. 2007.

Lim, S., et al., "Metamaterial-Based Electronically Controlled Transmission-Line Structure as a Novel Leaky-Wave Antenna With Tunable Radiation Angle and Beamwidth," *IEEE Transactions on Microwave Theory and Techniques*, 52(12):2678-2690, Dec. 2004.

Mata-Contreras, J., et al., "Experimental Performance of a Meta-Distributed Amplifier," *Proceedings of the 37th European Microwave Conference*, pp. 743-746, Oct. 2007.

Pozar, D.M., *Microwave Engineering*, 3rd Ed., John Wiley & Sons, pp. 565-575, (2005).

U.S. Appl. No. 11/963,710, filed Dec. 21, 2007, entitled "Power Combiners and Dividers Based on Composite Right and Left Handed Metamaterial Structures" by Dupuy et al.

U.S. Appl. No. 61/039,407, filed Mar. 25, 2008, entitled "Advanced Active Metamaterial Antenna Systems" by Gummalla et al.

U.S. Appl. No. 61/094,839, filed Sep. 5, 2008, entitled "Frequency-Tunable Metamaterial Antenna Device" by Penev et al.

U.S. Appl. No. 61/116,232, filed Nov. 19, 2008, entitled "Tunable Metamaterial Antenna Structures" by Lopez et al.

* cited by examiner

ADVANCED ACTIVE METAMATERIAL ANTENNA SYSTEMS

PRIORITY CLAIMS AND RELATED APPLICATIONS

This patent document claims the benefit of the U.S. Provisional Patent Application Ser. No. 61/039,407 entitled "Advanced Active Metamaterial Antenna Systems," filed on Mar. 25, 2008. The entire disclosure of the provisional application is incorporated herein by reference.

BACKGROUND

This document relates to antennas and antenna systems based on metamaterial structures.

The propagation of electromagnetic waves in most materials obeys the right-hand rule for the (E,H,β) vector fields, where E is the electrical field, H is the magnetic field, and β is the wave vector (or propagation constant). The phase velocity direction is the same as the direction of the signal energy propagation (group velocity) and the refractive index is a positive number. Such materials are "right handed (RH)" materials. Most natural materials are RH materials. Artificial materials can also be RH materials.

A metamaterial (MTM) has an artificial structure. When designed with a structural average unit cell size ρ much smaller than the wavelength of the electromagnetic energy guided by the metamaterial, the metamaterial can behave like a homogeneous medium to the guided electromagnetic energy. Unlike RH materials, a metamaterial can exhibit a negative refractive index, and the phase velocity direction is opposite to the direction of the signal energy propagation where the relative directions of the (E,H,β) vector fields follow the left-hand rule. Metamaterials that support only a negative index of refraction with permittivity ∈ and permeability μ being simultaneously negative are pure "left handed (LH)" metamaterials.

Many metamaterials are mixtures of LH metamaterials and RH materials and thus are Composite Right and Left Handed (CRLH) metamaterials. A CRLH metamaterial can behave like a LH metamaterial at low frequencies and a RH material at high frequencies. Implementations and properties of various CRLH metamaterials are described in, for example, Caloz and Itoh, "Electromagnetic Metamaterials: Transmission Line Theory and Microwave Applications," John Wiley & Sons (2006). CRLH metamaterials and their applications in antennas are described by Tatsuo Itoh in "Invited paper: Prospects for Metamaterials," Electronics Letters, Vol. 40, No. 16 (August, 2004). CRLH metamaterials can be structured and engineered to exhibit electromagnetic properties that are tailored for specific applications and can be used in applications where it may be difficult, impractical or infeasible to use other materials. In addition, CRLH metamaterials may be used to develop new applications and to construct new devices that may not be possible with RH materials.

SUMMARY

Techniques, antenna systems and apparatus are provided based on composite right and left handed (CRLH) metamaterial (MTM) structures to couple CRLH MTM circuits to transistors to amplify signals in wireless RF receivers and transmitters.

In one aspect, an implementation of an antenna system is provided based on a composite right and left handed (CRLH) metamaterial (MTM) structure. This implementation includes a first MTM line, a second MTM line and transistors coupled to the first and second MTM lines. The first MTM line includes first CRLH blocks. Each first CRLH block includes at least one first CRLH unit cell structured to guide signals within a selected signal frequency region so that the first MTM line operates as a transmission line to guide a signal at a signal frequency in the selected signal frequency region along the first MTM line. The second MTM line includes second CRLH blocks. Each second CRLH block includes at least one second CRLH unit cell structured to wirelessly transmit or receive signals within the selected signal frequency region so that the second MTM line operates as a leaky wave antenna that wirelessly transmits or receives the signal at the signal frequency. Each of the transistors coupled to the first and second MTM lines includes a first terminal coupled to the first MTM line and a second terminal coupled to the second MTM line to amplify the signal that is guided by the first MTM line.

In the above system, the first CRLH unit cell in the first MTM line may be structured to wirelessly radiate or receive signals within a second, different selected signal frequency region so that the first MTM line operates as a leaky wave antenna that wirelessly radiates or receives a wireless signal in the second, different selected signal frequency region, and the second CRLH unit cell in the second MTM line may be structured to guide signals within the second selected signal frequency region so that the second MTM line operates as a transmission line to guide a signal in the second, different selected signal frequency region along the second MTM line.

In another aspect, implementations of CRLH MTM antenna systems are provided for frequency division duplex applications.

In another aspect, implementations of CRLH MTM antenna systems are provided for time division duplex applications.

For example, an antenna system for frequency division duplex (FDD) based on a composite right and left handed (CRLH) metamaterial (MTM) structure can be implemented to include first and second MTM transmission lines. The first MTM transmission line includes first CRLH blocks where each first CRLH block includes at least one first CRLH unit cell, the first MTM transmission line configured to operate as a first transmission line that guides a signal at a first frequency and to operate as a first leaky wave antenna that receives a signal at a second frequency. The second MTM transmission line includes second CRLH blocks where each second CRLH block includes at least one second CRLH unit cell, the second MTM transmission line configured to operate as a second transmission line that guides a signal at the second frequency and to operate as a second leaky wave antenna that transmits a signal at the first frequency. This system includes transistors coupled to the first and second MTM transmission lines, each transistor having a first terminal coupled to the first MTM transmission line and a second terminal coupled to the second MTM transmission line.

For another example, an TDD antenna system based on a CRLH MTM structure can be implemented to include first and second MTM transmission lines. The first MTM transmission line includes first tunable CRLH blocks and each first tunable CRLH block includes at least one CRLH unit cell. The first tunable CRLH blocks are configured to tune the first MTM transmission line to operate as a first transmission line that guides a signal at a frequency during a first time period and to tune the first MTM transmission line to operate as a first leaky wave antenna that receives a signal at the frequency during a second time period. The second MTM transmission line includes second tunable CRLH blocks and each second tunable CRLH block includes at least one CRLH unit cell. The second tunable CRLH blocks are configured to tune the second MTM transmission line to operate as a second transmission line that guides a signal at the frequency during the second time period and to tune the second MTM transmission line to operate as a second leaky wave antenna that transmits a signal at the frequency during the first time period. Transistors are coupled to the first and second MTM transmission lines, each transistor having a first terminal coupled to the first MTM transmission line and a second terminal coupled to the second MTM transmission line.

For another example, an TDD antenna system based on a CRLH MTM structure can be implemented to include first, second, third and fourth MTM transmission lines. The first MTM transmission line includes first CRLH blocks and each first CRLH block includes at least one first CRLH unit cell. The first MTM transmission line are configured to operate as a first transmission line that guides a signal at a frequency. The second MTM transmission line includes second CRLH blocks and each second CRLH block includes at least one second CRLH unit cell. The second MTM transmission line is configured to operate as a first leaky wave antenna that receives a signal at the frequency. The third MTM transmission line includes third CRLH blocks and each third CRLH block includes at least one third CRLH unit cell. The third MTM transmission line is configured to operate as a second leaky wave antenna that transmits a signal at the frequency. The fourth MTM transmission line includes fourth CRLH blocks and each fourth CRLH block includes at least one fourth CRLH unit cell. The fourth MTM transmission line is configured to operate as a second transmission line that guides a signal at the frequency. This system includes a switch for activating the first and third MTM transmission lines during a transmit time period and the second and fourth MTM transmission lines during a receive time period, transistors coupled to the first and third MTM transmission lines, and second transistors coupled to the second and fourth MTM transmission lines. The first CRLH unit cell is configured to have a first dispersion curve that includes a point in a guided region at the frequency, the second CRLH unit cell is configured to have a second dispersion curve that includes a point in a radiated region at the frequency, the third CRLH unit cell is configured to have a third dispersion curve that includes a point in the radiated region at the frequency, an the fourth CRLH unit cell is configured to have a fourth dispersion curve that includes a point in a guided region at the frequency.

For another example, a method for processing signals for FDD operations based on a CRLH MTM structure can be implemented to include configuring a first MTM transmission line to operate as a first transmission line that guides a signal at a first frequency and to operate as a first leaky wave antenna that receives a signal at a second frequency; configuring a second MTM transmission line to operate as a second transmission line that guides a signal at the second frequency and to operate as a second leaky wave antenna that transmits a signal at the first frequency; coupling a plurality of transistors to the first and second MTM transmission lines by coupling a first terminal of each transistor to the first MTM transmission line and a second terminal of each transistor to the second MTM transmission line; receiving a first signal at the first frequency at an input port; guiding the first signal through the first MTM transmission line which operates as the first transmission line at the first frequency; amplifying the first signal by using the plurality of transistors; transmitting the first signal through the second MTM transmission line which operates as the second leaky wave antenna at the first frequency; receiving a second signal at the second frequency through the first MTM transmission line which operates as the first leaky wave antenna at the second frequency; amplifying the second signal by using the plurality of transistors; guiding the second signal through the second MTM transmission line which operates as the second transmission line at the second frequency; and outputting the second signal from an output port.

For another example, a method for processing signals for TDD operations based on a CRLH MTM structure can be implemented to include configuring a first MTM transmission line to be tuned to operate as a first transmission line that guides a signal at a frequency during a first time period and to be tuned to operate as a first leaky wave antenna that receives a signal at the frequency during a second time period; configuring a second MTM transmission line to be tuned to operate as a second transmission line that guides a signal at the frequency during the second time period and to be tuned to operate as a second leaky wave antenna that transmits a signal at the frequency during the first time period; coupling a plurality of transistors to the first and second MTM transmission lines by coupling a first terminal of each transistor to the first MTM transmission line and a second terminal of each transistor to the second MTM transmission line; receiving a first signal at the frequency at an input port during the first time period; guiding the first signal through the first MTM transmission line which operates as the first transmission line at the frequency; amplifying the first signal by using the plurality of transistors; transmitting the first signal through the second MTM transmission line which operates as the second leaky wave antenna at the frequency; receiving a second signal at the frequency through the first MTM transmission line which operates as the first leaky wave antenna at the frequency during the second time period; amplifying the second signal by using the plurality of transistors; guiding the second signal through the second MTM transmission line which operates as the second transmission line at the frequency; and outputting the second signal from an output port.

For yet another example, a method for processing signals for TDD operations based on a CRLH MTM structure can be implemented to include configuring a first MTM transmission line based on first CRLH blocks to operate as a first transmission line that guides a signal at a frequency, where each first CRLH block includes at least one first CRLH unit cell. A second MTM transmission line based on second CRLH blocks is configured to operate as a first leaky wave antenna that receives a signal at the frequency, where each second CRLH block includes at least one second CRLH unit cell. A third MTM transmission line based on third CRLH blocks is configured to operate as a second leaky wave antenna that transmits a signal at the frequency, wherein each third CRLH block includes at least one third CRLH unit cell. A fourth MTM transmission line based on fourth CRLH blocks is configured to operate as a second transmission line that guides a signal at the frequency, wherein each fourth CRLH block includes at least one fourth CRLH unit cell. This method uses a switch to activate the first and third MTM transmission lines during a transmit time period and the second and fourth MTM transmission lines during a receive time period, to couple first transistors to the first and third MTM transmission lines, and to couple second transistors to the second and fourth MTM transmission lines. The first CRLH unit cell is configured to have a first dispersion curve that includes a point in a guided region at the frequency, the second CRLH unit cell is configured to have a second dispersion curve that includes a point in a radiated region at the frequency, the third CRLH unit cell is configured to have a third dispersion curve that includes a point in the radiated region at the frequency, and the fourth CRLH unit cell is configured to have a fourth dispersion curve that includes a point in a guided region at the frequency.

These and other aspects, implementations and their variations are described in detail in the attached drawings, the detailed description and the claims.

BRIEF DESCRIPTION OF THE DRAWINGS

FIG. 2(*f*) shows a RH microstrip, which can be equivalently expressed with the $C_R$ and $L_R$.

DETAILED DESCRIPTION

Examples and implementations of active antenna systems based on MTM structures disclosed in this document can be configured in compact packages, use relatively less components and provide improved performance for wireless communications by integrating a distributed power amplifier with CRLH MTM structures. Base stations, access points and femto cells used in wireless communications are a few examples of communication equipment that can benefit from the use of such active MTM antenna systems. Many communication systems are designed based on time division duplex (TDD) or frequency division duplex (FDD) to provide communication between a base station and a mobile device (client). These systems often use a Tx/Rx switch or a diplexer to separate the signal between transmit and receive paths. The active MTM antenna systems presented in this document employ a combination of a CRLH Leaky Wave Antenna (LWA) and CRLH Transmission Line (TL) with a distributed power amplifier to achieve the functionalities of amplification, switching and high gain antenna in a compact footprint. A distributed power amplifier can be implemented in various configurations. Some implementations of distributed power amplifiers can exhibit broadband characteristics in terms of gain, group delay, and impedance matching that are suitable for systems in this document and are disclosed in Pozar, "Microwave Engineering," third edition, Wiley Publishing Company (2005), pp. 565-575.

Figure 1:
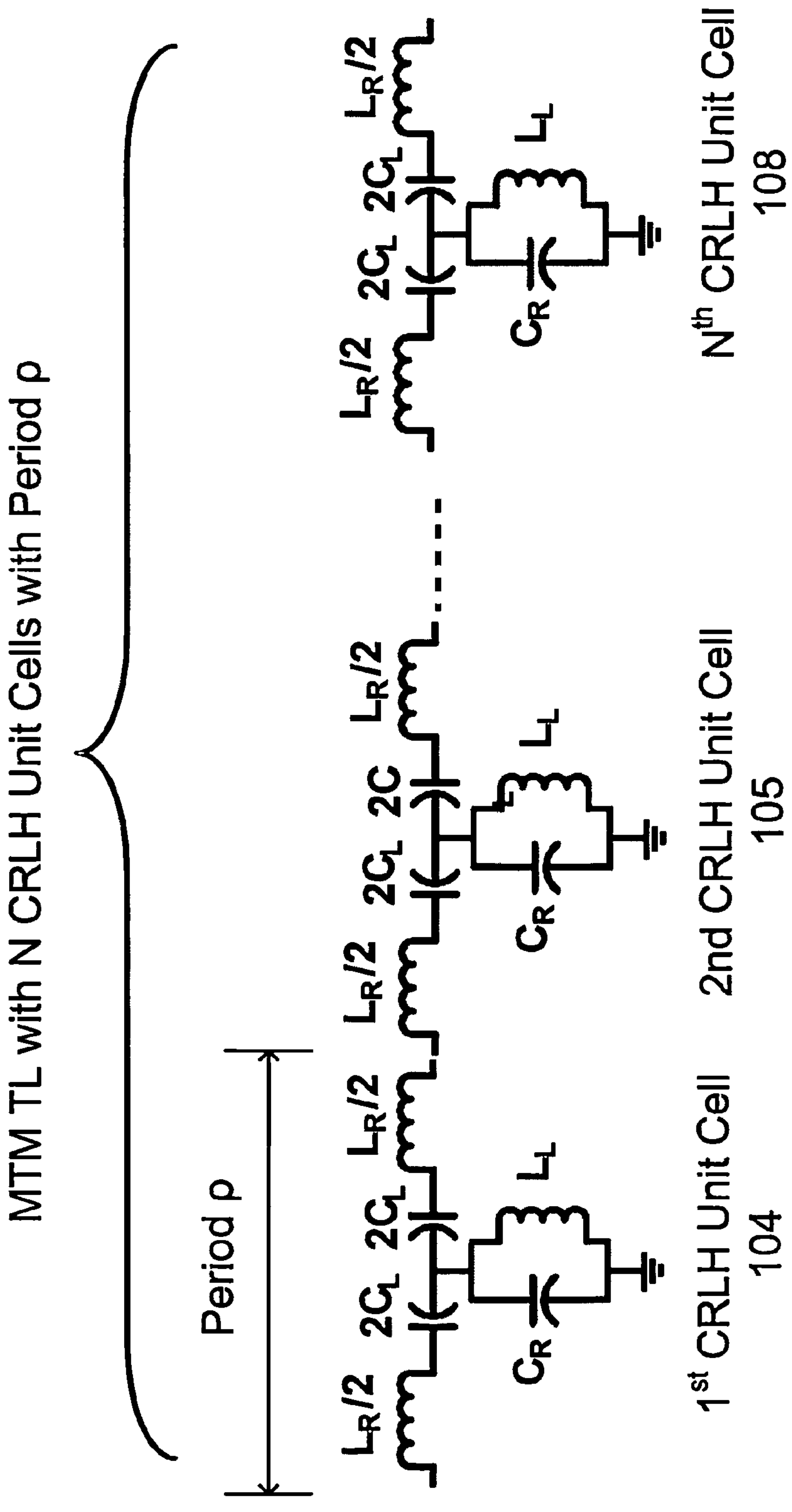
FIG. 1 shows an equivalent circuit model for the MTM TL using N symmetric CRLH unit cells connected in series with a period ρ.
Figure 2A:
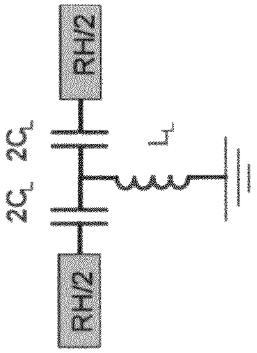
FIGS. 2(*a*)-2(*e*) show various examples of CRLH unit cell designs.
Figure 2B:
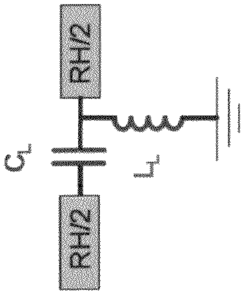
Figure 2C:
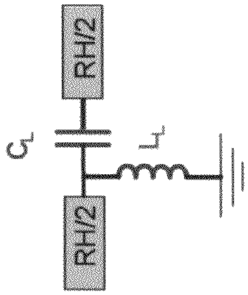
Figure 2D:
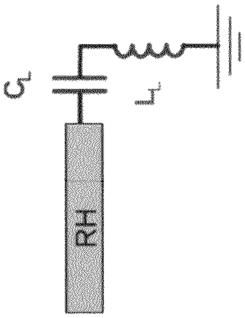
Figure 2E:
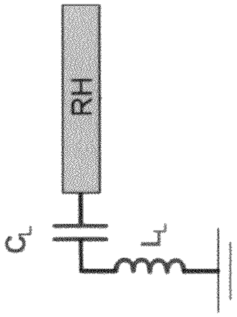
Figure 2F:
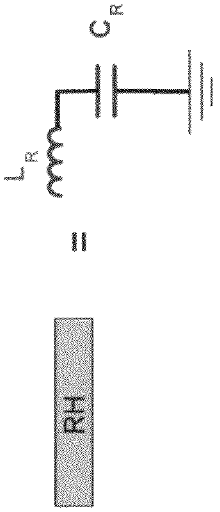

Metamaterial (MTM) structures can be used to construct antennas, transmission lines and other RF components and devices, allowing for a wide range of technology advancements such as functionality enhancements, size reduction and performance improvements. FIG. 1 shows the equivalent circuit model of an example of a metamaterial transmission line (MTM TL) that is made by coupling N CRLH unit cells in series with a period ρ. As illustrated, N symmetric CRLH unit cells 104, 105, . . . and 108 are connected in series. Each CRLH unit cell is constructed by using three resonant L-C circuits in the order of series L-C, shunt L-C, and series L-C. These L-C resonant circuits are connected together by a T-junction at the common end. The components in the series L-C circuit are represented by $L_R/2$ and $2C_L$. The components in the shunt L-C circuit are represented by $L_L$ and $C_R$. Here, the subscript R indicates "right handed (RH)" and the subscript L indicates "left handed (LH)." $L_R$ is a RH series inductance, $C_L$ is a LH series capacitance, $L_L$ is a LH shunt inductance, and $C_R$ is a RH shunt capacitance. These elements represent equivalent circuit parameters of the CRLH unit cell.

The MTM transmission line in FIG. 1 is not really a "transmission line" per se but rather a MTM circuit or MTM line that can be configured with proper circuit structure and circuit parameters to operate either as a transmission line to guide a radio signal along the line or an antenna that wirelessly transmits or receives a radio wave signal. Such a MTM line includes CRLH blocks and each CRLH block includes at least one CRLH unit cell structured to either guide signals within a selected signal frequency region so that the MTM line operates as a transmission line to guide a signal at a signal frequency in the selected signal frequency region along the first MTM line, or wirelessly transmit or receive signals within the selected signal frequency region so that the second MTM line operates as a leaky wave antenna that wirelessly transmits or receives the signal at the signal frequency. Various CRLH unit cell structures and different MTM line configurations can be used.

FIGS. 2(*a*)-2(*e*) show examples of other forms of the CRLH unit cell. The block indicated with "RH" in these figures represents a RH transmission line, which can be equivalently expressed with the RH shunt capacitance $C_R$ and the RH series inductance $L_R$, as shown in FIG. 2(*f*). Thus, the CRLH unit cell shown in FIG. 2(*a*) is equivalent to the symmetric form shown in FIG. 1. Variations of the CRLH unit cell structures include a structure as shown in FIG. 2(*a*) but with RH/2 and CL interchanged; and structures as shown in FIGS. 2(*a*)-2(*c*) but with RH/4 on one side and 3RH/4 on the other side instead of RH/2 on both sides. The MTM structures can be implemented based on these CRLH unit cells by using distributed circuit elements, lumped circuit elements or a combination of both, and can be fabricated on various circuit platforms, including circuit boards such as a FR-4 Printed Circuit Board (PCB) or a Flexible Printed Circuit (FPC) board. Examples of other fabrication techniques include thin film fabrication techniques, system on chip (SOC) techniques, low temperature co-fired ceramic (LTCC) techniques, and monolithic microwave integrated circuit (MMIC) techniques.

Figure 3A:
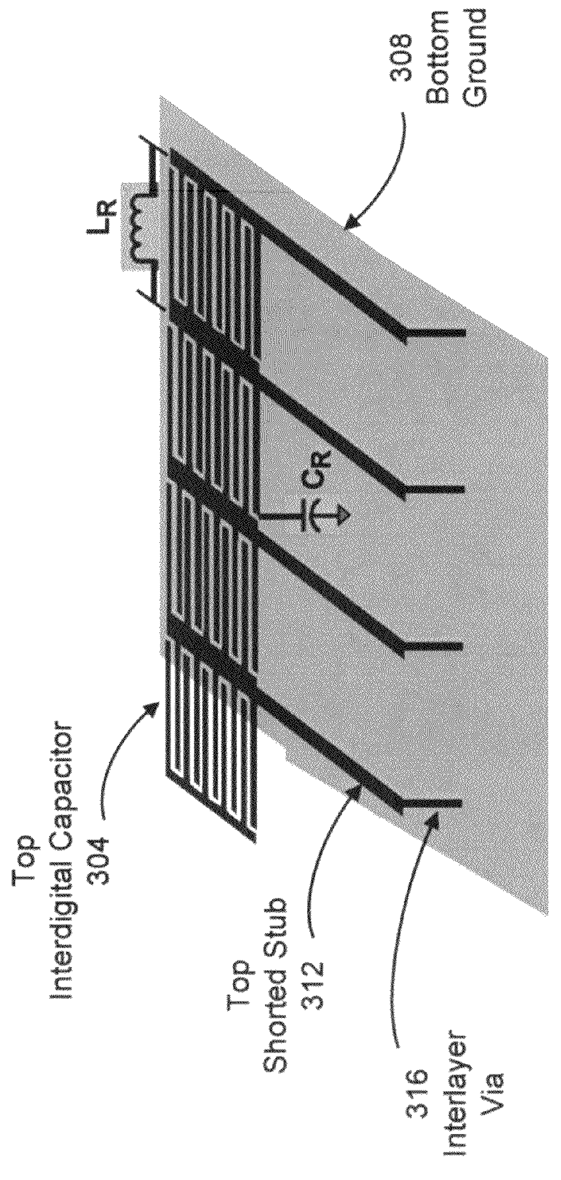
FIGS. 3(*a*) and 3(*b*) show an example of the MTM TL implementation using four interdigital capacitors and four shorted stubs, illustrating the 3D view and top 2D view of the structure, respectively.
Figure 3B:
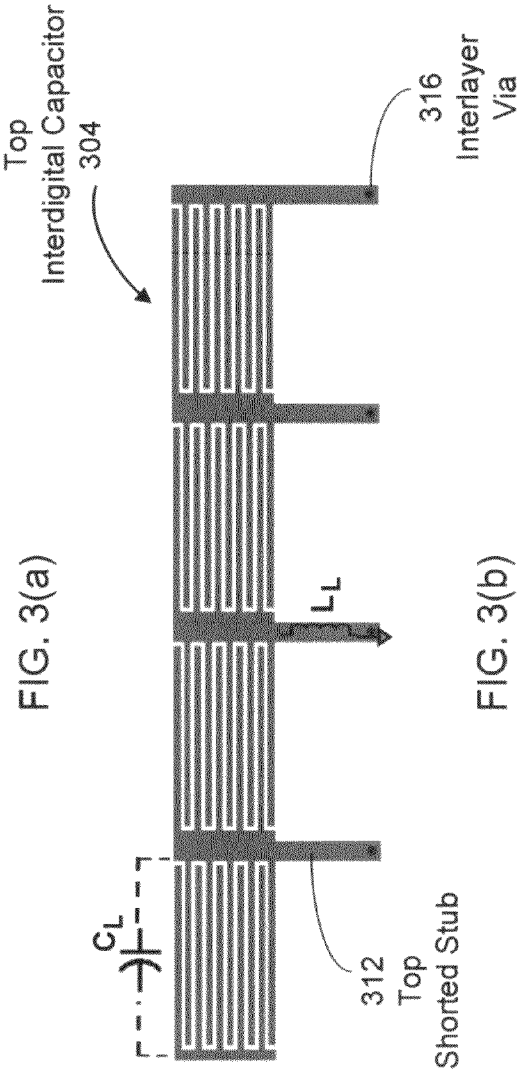

FIGS. 3(*a*) and 3(*b*) shows one implementation example of the MTM TL by using distributed circuit elements in two metallization layers formed on two surfaces of a substrate. FIG. 3(*a*) shows a 3D perspective view of the MTM TL and FIG. 3(*b*) shows a 2D view of the structure of the top metallization layer. In this example, top interdigital capacitors 304 are printed on the top surface of the substrate such as the FR4 PCB. A bottom ground 308 can be formed on the bottom surface of the substrate. This example has four top interdigital capacitors 304 connected in series with top shorted stubs 312 attached between adjacent top interdigital capacitors 304. The other end of each of the top shorted stubs 312 is shorted to the bottom ground 308 by an interlayer via 316 penetrating through the substrate to connect the top and bottom metallization layers. The substrate is sandwiched between the top metallization layer where the top interdigital capacitors 304 and top shorted stubs 312 are formed and the bottom metallization layer where the bottom ground 308 is formed. The top interdigital capacitor 304 provides the $C_L$, and the top shorted stub 312 and interlayer via 316 provide the $L_L$. The conductive fingers of the top interdigital capacitor 304 and the top shorted stub 312 contribute to the $L_R$. The $C_R$ is provided by the dielectric gap between the top conductive part (i.e., the top interdigital capacitors 304 and the top shorted stubs 312) and the bottom ground 308 on the bottom surface.

Figure 4:
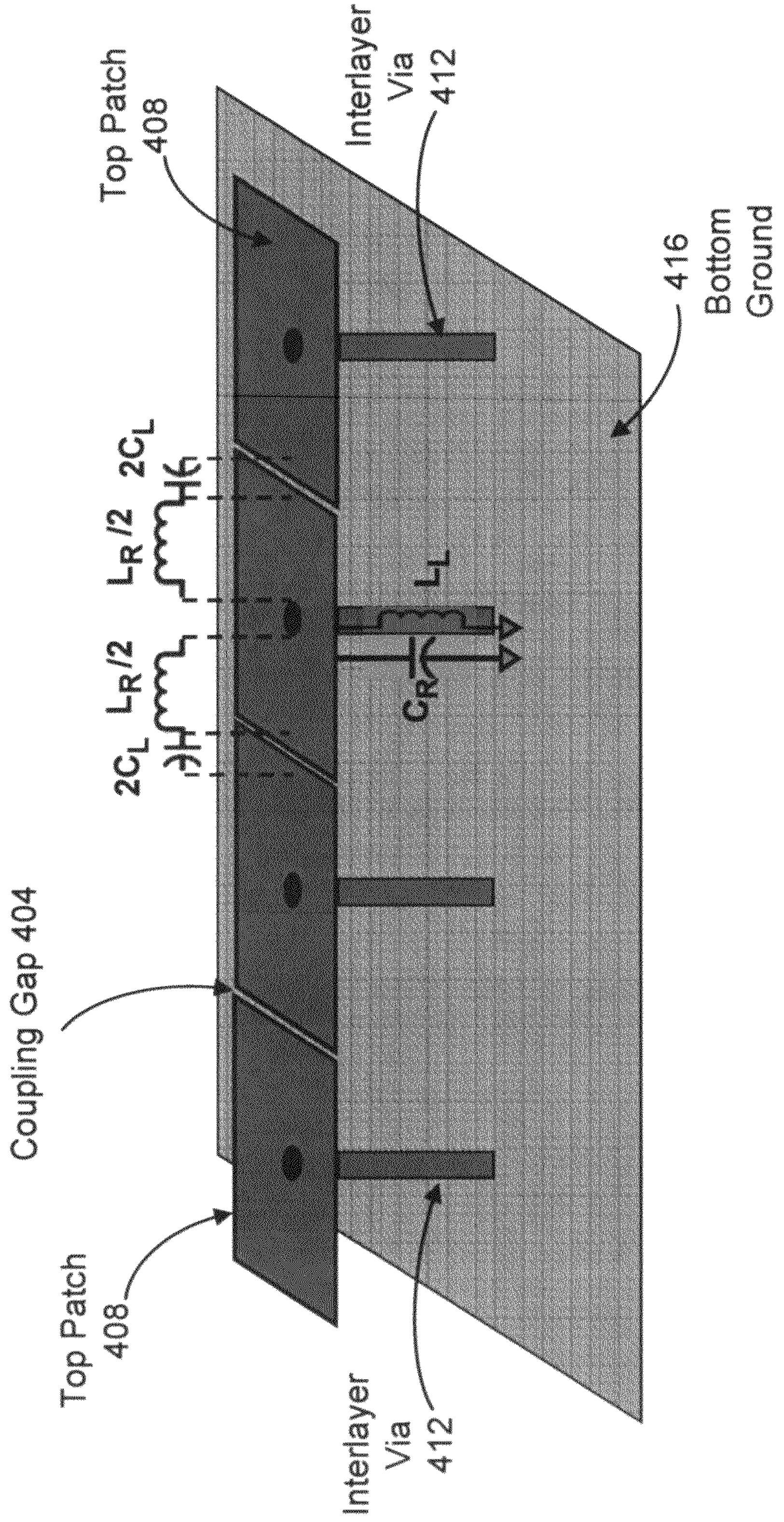
FIG. 4 shows another example of the MTM TL implementation based on MTM cells in a mushroom structure.

FIG. 4 shows another example of the MTM TL implementation that includes four MTM unit cells in a mushroom structure. Each unit cell includes a top patch 408 formed on the top surface of the substrate, an interlayer via 412 that penetrates the substrate to connect the top patch 408 to the bottom ground 416 on the bottom surface of the substrate. The top patches 408 of two adjacent unit cells are separated and electromagnetically coupled through a coupling gap 404. The substrate is sandwiched between the top metallization layer where the top patches 408 are formed and the bottom metallization layer where the ground 416 is formed. The coupling gap 404 provides the $C_L$. The top patch 408 provides the $L_R$. The interlayer via 412 effectuates the inductance $L_L$. The capacitance $C_R$ is provided by the dielectric gap between the top patch 408 and the bottom ground 416. Thus, this structure can be equivalently expressed with the symmetric form of the CRLH unit cell shown in FIGS. 1 and 2(*a*). In cases where the capacitance provided by the coupling gap is not sufficient, the mushroom structure can be modified by inserting a metal layer between the top layer and the ground to increase coupling.

A pure LH metamaterial follows the left-hand rule for the vector trio (E,H,β), and the phase velocity direction is opposite to the signal energy propagation direction. Both the permittivity ∈ and permeability μ of the LH material are simultaneously negative. A CRLH metamaterial can exhibit both left-handed and right-handed electromagnetic properties depending on the regime or frequency of operation. The CRLH metamaterial can exhibit a non-zero group velocity when the wavevector (or propagation constant) of a signal is zero. In an unbalanced case, there is a bandgap in which electromagnetic wave propagation is forbidden. In a balanced case, the dispersion curve does not show any discontinuity at the transition point of the propagation constant $\beta(\omega_o)=0$ between the left- and right-handed regions, where the guided wavelength is infinite, i.e., $\lambda_g=2\pi/|\beta|\rightarrow\infty$, while the group velocity is positive:

$$v_g = \left.\frac{d\omega}{d\beta}\right|_{\beta=0} > 0. \qquad \text{Eq. (1)}$$

This state corresponds to the zeroth order mode m=0 in a transmission line (TL) implementation. The CRLH structure supports a fine spectrum of resonant frequencies with the dispersion relation that extends to the negative β region. This allows a physically small device to be built that is electrically large with unique capabilities in manipulating and controlling near-field around the antenna which in turn controls the far-field radiation patterns. When this TL is used as a zeroth order resonator, it allows a constant amplitude and phase resonance across the entire resonator. This is achieved when the propagation constant β is zero. Under this condition, an infinite wavelength can exist, and thus both the phase and amplitude of a wave propagating along the TL are independent of position, while the TL supports a stationary wave. A zeroth order resonator has an open-circuited first end and a loosely (e.g. capacitively) coupled second end, and can be loosely coupled with additional components such as oscillators, transistors, etc. Such a zeroth order resonator can be used to build MTM-based power combiners and splitters or dividers, directional couplers, matching networks, and leaky wave antennas. Examples and implementation of CRLH unit cells, zeroth order resonators, power combiners and splitters or dividers, and various other related aspects are described in the U.S. patent application Ser. No. 11/963,710, entitled "Power Combiners and Dividers Based on Composite Right and Left Handed Metamaterial Structures," the entire disclosure of which is incorporated herein by reference.

Figure 5:
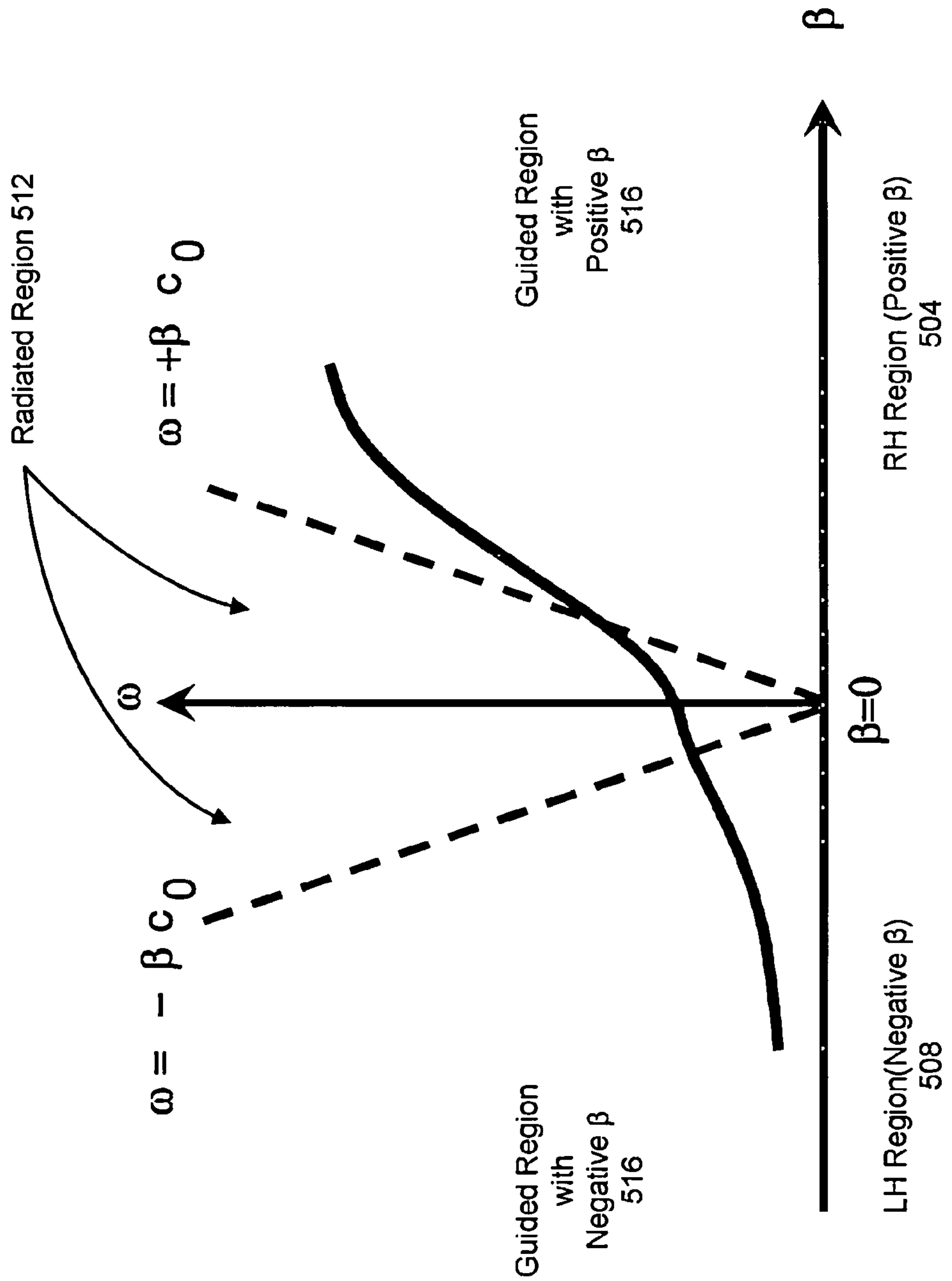
FIG. 5 shows a schematic plot of the dispersion curve for the fundamental mode (zeroth order mode) of a balanced MTM TL.

FIG. 5 shows the dispersion curve using a balanced CRLH unit cell. In the unbalanced case, there are two possible zero$^{th}$ order resonances, $\omega_{se}$ and $\omega_{sh}$, which can support an infinite wavelength (β=0, fundamental mode) and are expressed as:

$$\omega_{sh} = \frac{1}{\sqrt{C_R L_L}} \text{ and } \omega_{se} = \frac{1}{\sqrt{C_L L_R}}, \quad \text{Eq. (2)}$$

where $C_R L_L \neq C_L L_R$. At $\omega_{se}$ and $\omega_{sh}$, both group velocity ($v_g=d\omega/d\beta$) and the phase velocity ($v_p=\omega/\beta$) are zero. When the CRLH unit cell is balanced, these resonant frequencies coincide as:

$$\omega_{se}=\omega_{sh}=\omega_0, \quad \text{Eq. (3)}$$

where $C_R L_L = C_L L_R$. At $\omega_{se}$ and $\omega_{sh}$, the positive group velocity ($v_g=d\omega/d\beta$) and the zero phase velocity ($v_p=\omega/\beta$) can be obtained. For the balanced case, the general dispersion curve can be expressed as:

$$\beta p = \omega\sqrt{L_R C_R} - \frac{1}{\omega\sqrt{L_L C_L}}. \quad \text{Eq. (4)}$$

The propagation constant β is positive in the RH region 504, and that in the LH region 508 is negative. Each region can be divided into the radiated region 512 (fast wave region) and the guided region 516 (slow wave region) with respect to air lines $\omega=\pm\beta C_0$. The MTM TL has the potential to radiate energy in the radiated region 512, whereas it presents characteristics of a transmission line in the guided region 516. Therefore, it is possible to use only one MTM structure for the operation as a transmission line or as a travelling wave antenna. A leaky wave antenna (LWA) is one of the examples that can be used in this application. A conventional LWA without MTM structures requires complicated exciting mechanisms to create the higher order mode to radiate. In addition, the scanning angle for the conventional LWA is very limited. An MTM LWA based on MTM TLs can produce a fundamental mode that radiates with a simple excitation feed. Various aspects of conventional as well as MTM leaky wave antennas are described in, for example, Caloz and Itoh, "Electromagnetic Metamaterials: Transmission Line Theory and Microwave Applications," John Wiley & Sons (2006); and Lim et al., "Metamaterial-Based Electronically Controlled Transmission-Line Structure as a Novel Leaky-Wave Antenna with Tunable Radiation Angle and Beamwidth," IEEE Trans. Microwave Theory and Technique, Vol. 52, No. 12, December 2004, pp. 2678-2690. The propagation constant associated with an MTM TL has both negative and positive values, and the dispersion curve cuts through the radiated region 512 in the dispersion diagram. Therefore, the TL and LWA functions can be realized by properly designing the MTM TL to operate either in the radiated region 512 or in the guided region 516 at specific operation frequencies.

Based on the above MTM properties, an antenna system can be constructed based on a CRLH MTM structure and includes a first MTM line, a second MTM line and transistors coupled to the first and second MTM lines. The first MTM line includes first CRLH blocks. Each first CRLH block includes at least one first CRLH unit cell structured to guide signals within a selected signal frequency region so that the first MTM line operates as a transmission line to guide a signal at a signal frequency in the selected signal frequency region along the first MTM line. The second MTM line includes second CRLH blocks. Each second CRLH block includes at least one second CRLH unit cell structured to wirelessly transmit or receive signals within the selected signal frequency region so that the second MTM line operates as a leaky wave antenna that wirelessly transmits or receives the signal at the signal frequency. Each of the transistors coupled to the first and second MTM lines includes a first terminal coupled to the first MTM line and a second terminal coupled to the second MTM line to amplify the signal that is guided by the first MTM line. Both frequency division duplex (FDD) and time division duplex (TDD) MTM systems can be constructed for various applications.

Figure 6:
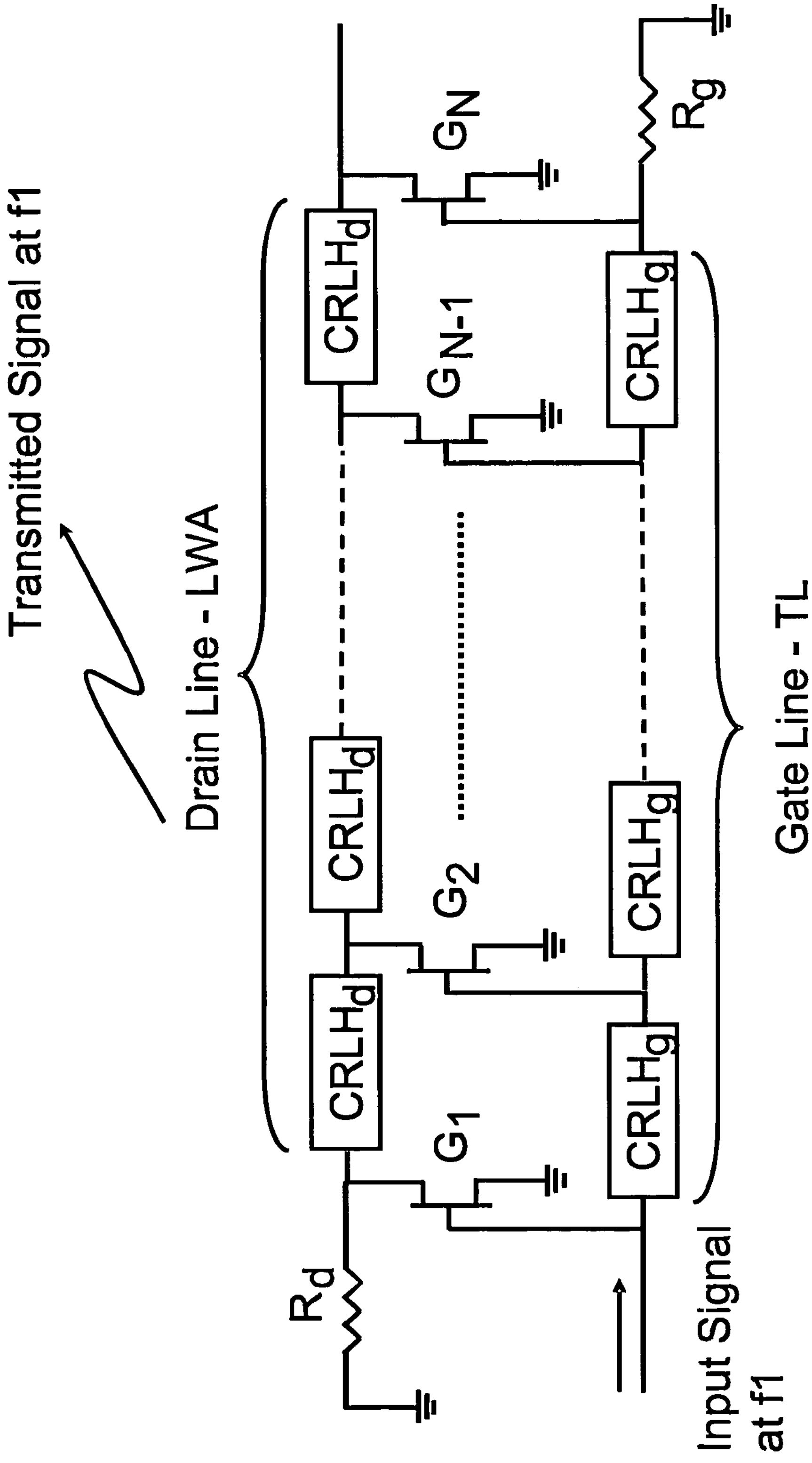
FIG. 6 shows an example of the active MTM antenna system for a FDD application, where an input signal is received from the base station/access point, then amplified and transmitted to the client at a first frequency f1.
Figure 7:
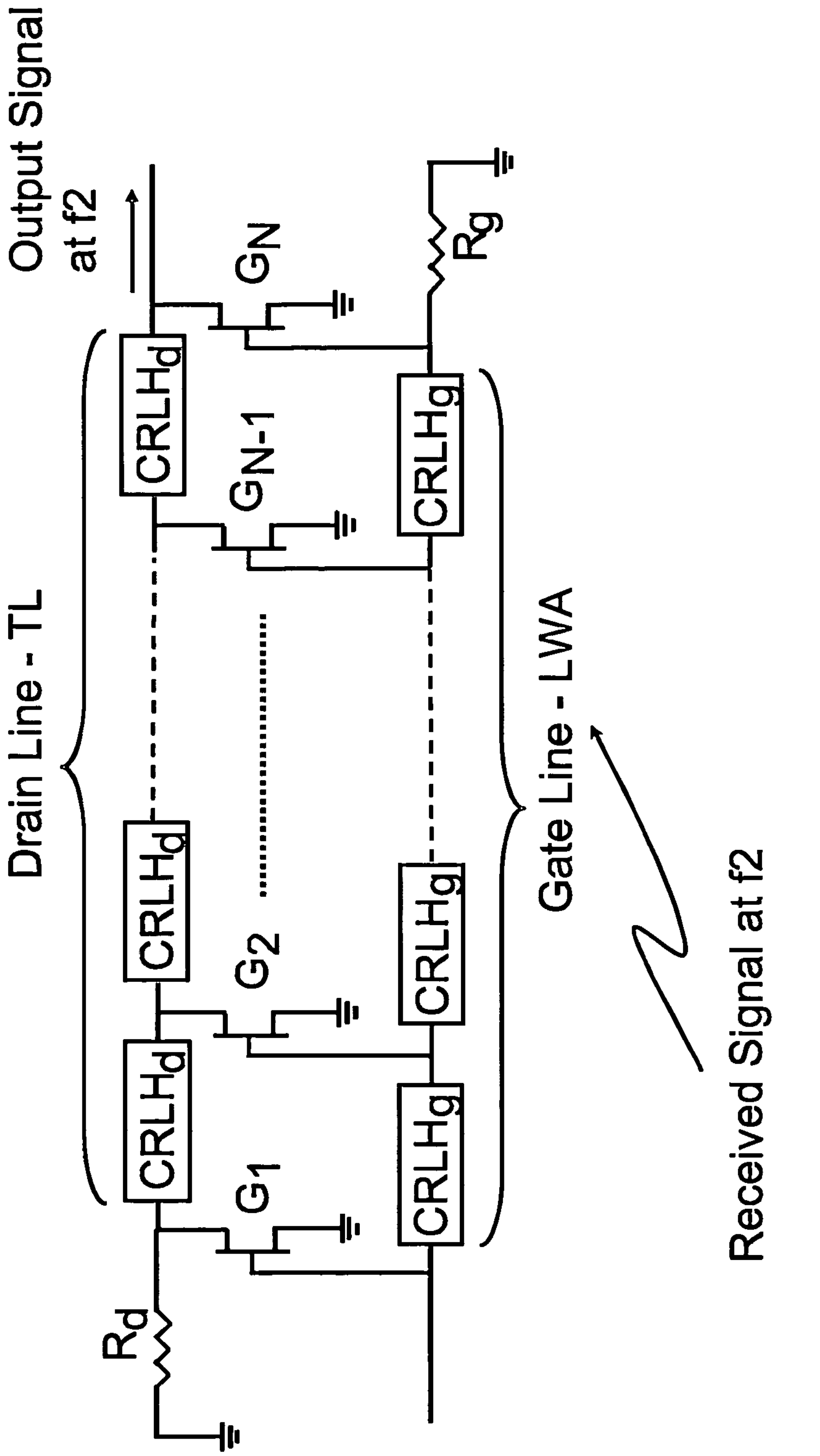
FIG. 7 shows an example of the active MTM antenna system for a FDD application, where a signal is received from the client, then amplified and outputted to the base station/access point at a second frequency f2.

FIGS. 6 and 7 show an example of the active MTM antenna system for a frequency division duplex (FDD) application in two FDD operation modes. The FDD scheme uses different frequencies f1 and f2 for communications from a base station/access point to a client and for communications from the client to the base station/access point. This exemplary FDD active MTM antenna system includes an array of transistors, $G_1, G_2, \ldots, G_N$, each connected to a gate line at the gate and to a drain line at the drain. The source terminal of each transistor is grounded. The transistors in this FDD system can be implemented by various transistor designs, such as field effect transistors (FETs), bipolar junction transistors and various transistor power amplifiers. When bipolar junction transistors are used in this system, the three terminals of the FET shown in FIGS. 6 and 7 are replaced with the base, emitter and collector terminals, with the gate line connected to the base and the drain line connected to the emitter or collector depending on the junction type. Furthermore, depending on the transistor technology used, each of the gate and drain lines can be connected to any terminal of the transistor.

In FIGS. 6 and 7, the gate line includes a series of $CRLH_g$ blocks, and the drain line includes a series of $CRLH_d$ blocks. Each of the $CRLH_g$ and $CRLH_d$ blocks is a metamaterial transmission line (MTM TL), i.e., a $CRLH_g$ MTM TL or a $CRLH_d$ MTM TL, which is constructed with one or more CRLH unit cells. The gate and drain lines for the FDD application are structured to behave differently at two different frequencies, f1 and f2.

Two FDD operation modes are shown. FIG. 6 shows the case where an input signal is received from the base station/access point, then amplified and transmitted to the client at a first frequency f1. FIG. 7 shows the case where a signal is received from the client, then amplified and outputted to the base station/access point at a second frequency f2.

In operation, to receive the input signal from the base station/access point, and amplify and transmit it to the client at a frequency f1, the active MTM antenna system is configured in such a way that the dispersion curve associated with the gate line is in the guided region, and that associated with the drain line is in the radiated region at this frequency. This indicates that, at the frequency f1, the gate line operates as a transmission line (TL), and the drain line operates as a leaky wave antenna (LWA) as shown in FIG. 6. Conversely, to amplify the received signal from the client and present it at the output port to the base station/access point at the frequency f2, the active MTM antenna system is configured in such a way that the dispersion curve associated with the gate line is in the radiated region, and that associated with the drain line is in the guided region at this frequency. This indicates that, at the frequency f2, the drain line operates as a transmission line (TL), and the gate line operates as a leaky wave antenna (LWA) as shown in FIG. 7.

This FDD system has two different MTM TLs, the $CRLH_g$ MTM TLs ($CRLH_g$ blocks) for the gate line and the $CRLH_d$ MTM TLs ($CRLH_d$ blocks) for the drain line, to operate at two different frequencies, f1 and f2. At f1, the $CRLH_g$ MTM TLs exhibit TL characteristics, whereas $CRLH_d$ MTM TLs exhibit LWA characteristics. Therefore, at the frequency f1, the $CRLH_g$ MTM TLs should operate in the guided region and the $CRLH_d$ MTM TLs should operate in the radiated region. On the other hand, at the frequency f2, the $CRLH_g$ MTM TLs should operate in the radiated region and the $CRLH_d$ MTM TLs should operate in the guided region.

Figure 8:
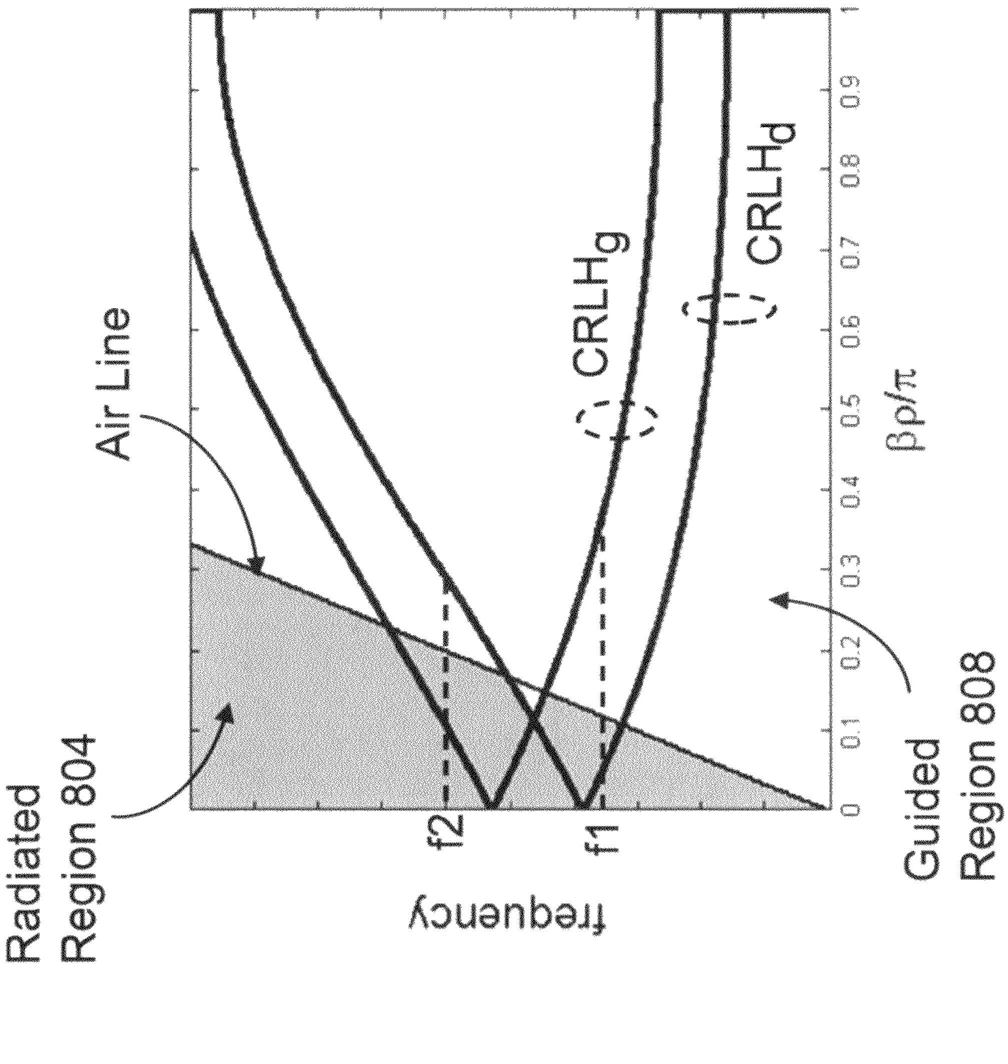
FIG. 8 shows schematic dispersion curves corresponding to the $CRLH_g$ MTM TL and $CRLH_d$ MTM TL separately for the FDD application, where the $CRLH_d$ dispersion curve is in the radiated region and the $CRLH_g$ dispersion curve is in the guided region at f1, whereas the $CRLH_g$ dispersion curve is in the radiated region and the $CRLH_d$ dispersion curve is in the guided region at f2.

FIG. 8 shows schematic dispersion curves corresponding to the $CRLH_g$ unit cell and $CRLH_d$ unit cell separately. The dispersion curve in the LH region is mirrored in the positive side for easy comparison to the dispersion curve in the RH region. The above selection of the radiated region or the guided region can be achieved if the $CRLH_g$ unit cell and $CRLH_d$ unit cell are designed to have the dispersion curves as shown in FIG. 8. At the frequency f1, the $CRLH_d$ dispersion curve is in the radiated region 804 and the $CRLH_g$ dispersion curve is in the guided region 808. On the other hand, at the frequency f2, the $CRLH_g$ dispersion curve is in the radiated region 804 and the $CRLH_d$ dispersion curve is in the guided region 808.

Figure 9:
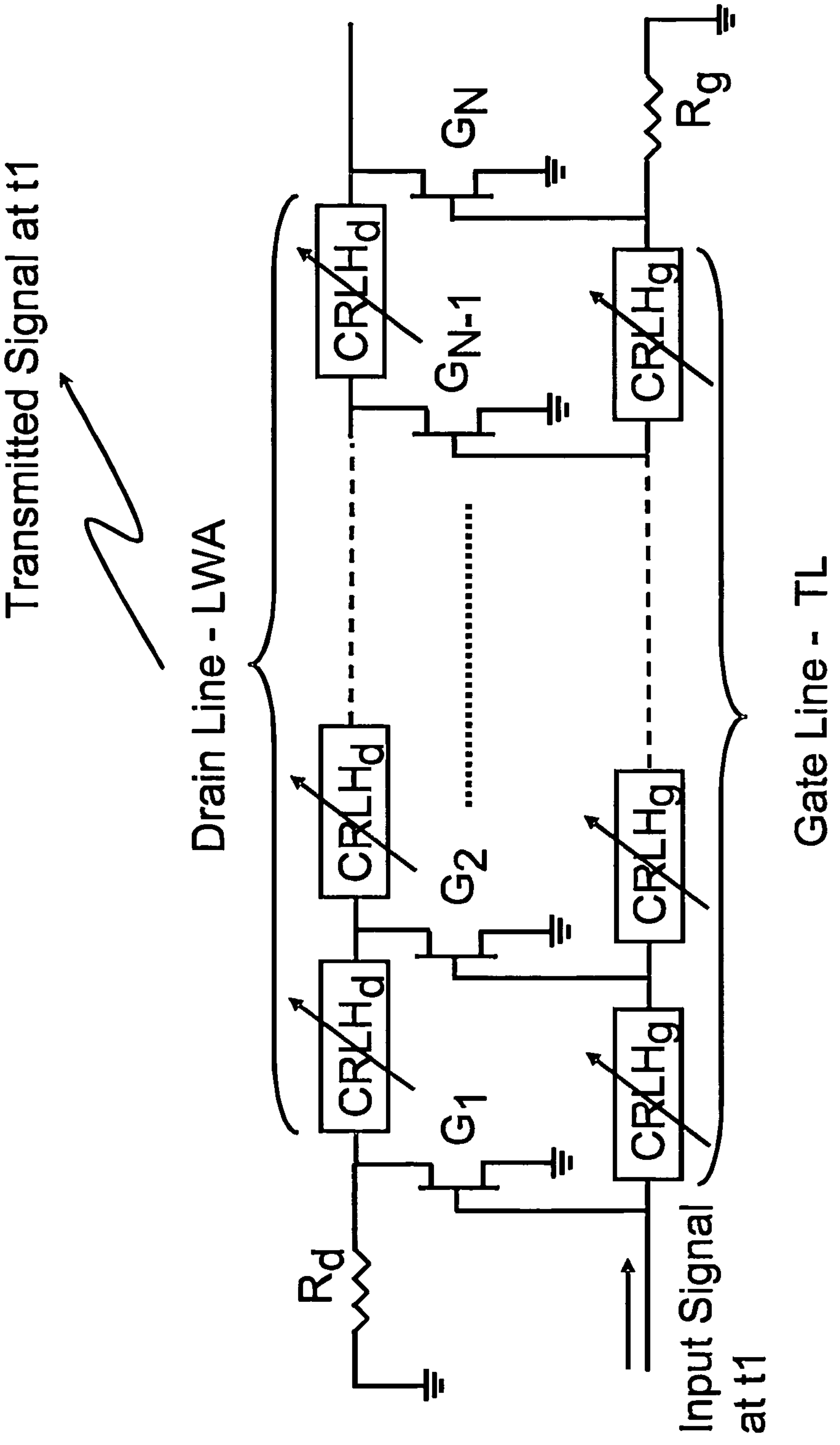
FIG. 9 shows an example of the active MTM antenna system for a TDD application using tunable $CRLH_g$ and $CRLH_d$ MTM TLs, where the signal from the base station/access point is received at the input port, then amplified and transmitted to the client at time t1.
Figure 10:
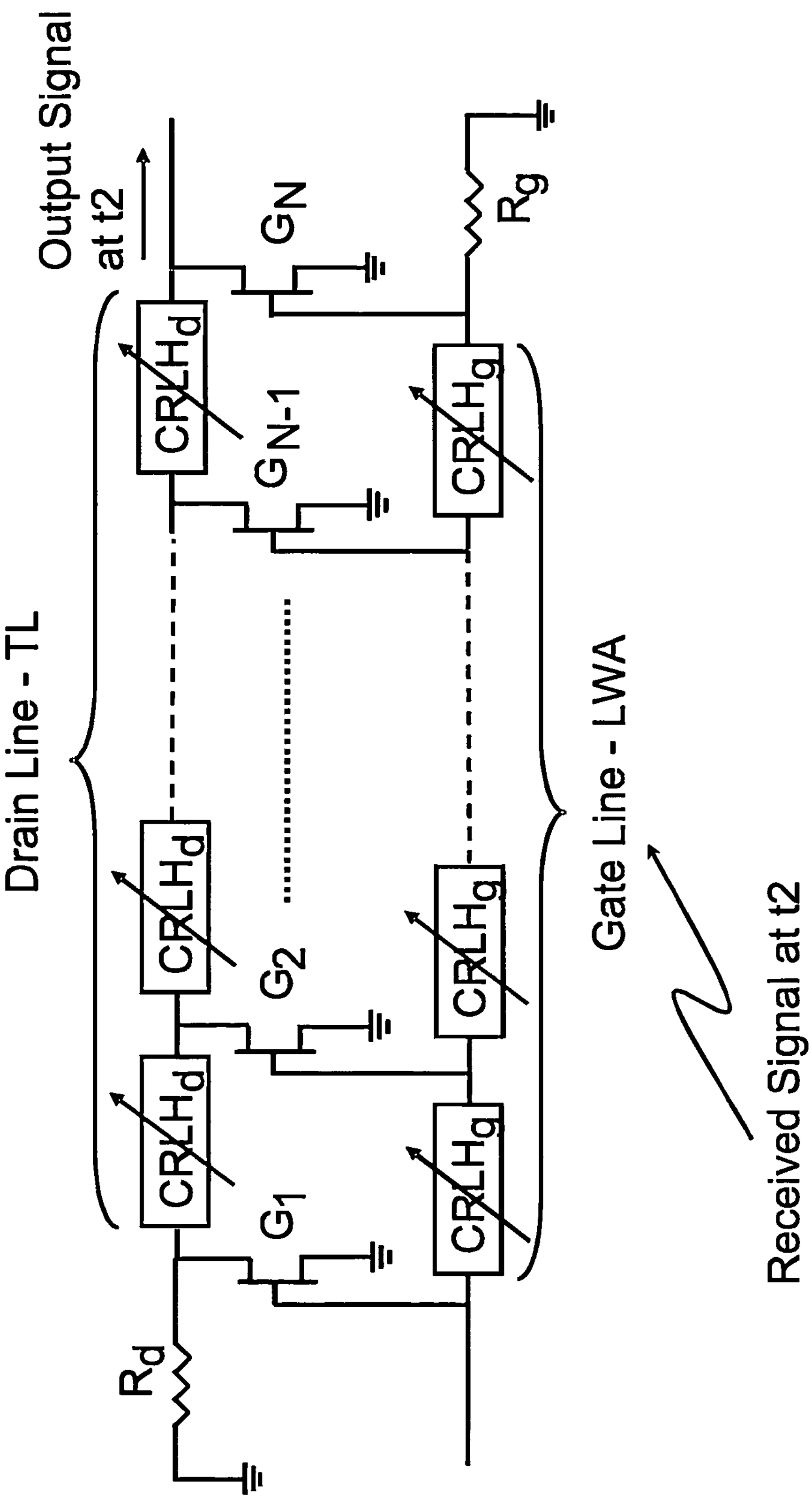
FIG. 10 shows an example of the active MTM antenna system for a TDD application using tunable $CRLH_g$ and $CRLH_d$ MTM TLs, where the signal received from the client is amplified and presented at the output port to the base station/access point at time t2.

FIGS. 9 and 10 show an example of the active MTM antenna system for a time division duplex (TDD) application. Similar to the structure for the FDD case shown in FIGS. 6 and 7, this exemplary active MTM antenna system for a TDD includes an array of transistors, $G_1$, $G_2$, . . . , $G_N$, each connected to a gate line at the gate and to a drain line at the drain. The source terminal of each transistor is grounded. This example uses a FET but any type of transistor can be used. In an example of using a BJT, the above three terminals are replaced with the base, emitter and collector terminals, with the gate line connected to the base and the drain line connected to the emitter or collector depending on the junction type. Furthermore, depending on the transistor technology used, each of the gate and drain lines can be connected to any terminal of the transistor. The gate line includes a series of $CRLH_g$ blocks, and the drain line includes a series of $CRLH_d$ blocks. Each of the $CRLH_g$ and $CRLH_d$ blocks is a metamaterial transmission line (MTM TL), i.e., a $CRLH_g$ MTM TL or a $CRLH_d$ MTM TL, which is constructed with one or more CRLH unit cells. In the present example shown in FIGS. 9 and 10, each $CRLH_g$ or $CRLH_d$ MTM TL ($CRLH_g$ or $CRLH_d$ block) operates as a tunable circuit for controlling the gate or drain line. In this TDD case, transmitted and received signals are multiplexed in time with the gate and drain lines operating at one frequency, f. Thus, the gate and drain lines are structured to operate at the same frequency for the TDD application.

At time t1 during operation, the $CRLH_g$ MTM TLs ($CRLH_g$ blocks) are tuned to make the gate line correspond to the TL, while the $CRLH_d$ MTM TLs ($CRLH_d$ blocks) are tuned to make the drain line correspond to the LWA as shown in FIG. 9. The input signal from the base station/access point is thus received at the input port, amplified and transmitted to the client at time t1. At another time t2, the $CRLH_g$ MTM TLs are tuned to make the gate line correspond to the LWA, while the $CRLH_d$ MTM TLs are tuned to make the drain line correspond to the TL as shown in FIG. 10. The received signal from the client is thus amplified and presented at the output port to the base station/access point at time t2. In a TDD application, the system is either in the transmit or receive operation but not both at the same time. Therefore, the gate line can be designed to operate in the radiated region and the drain line can be designed to operate in the guided region at one time, and vice versa at a different time by using the tunable circuits.

This TDD system uses the gate line and drain line to operate as an antenna and TL, respectively, at one time, and vice versa at a different time. To accomplish this, tuning techniques can be used to switch the gate line and drain line between the TL and LWA. For example, a control circuit can be included in the system to send control signals to the tuning circuits for selection of TL and LWA states. The control circuit may include a software-driven digital IC, such as an Application Specific IC (ASIC) or a Field-Programmable Gate Array (FPGA), to perform the logical functions for the tuning operations that electronically tune tunable TLs as the gate and drain lines to operate at different states of the dispersion curve.

Figure 11:
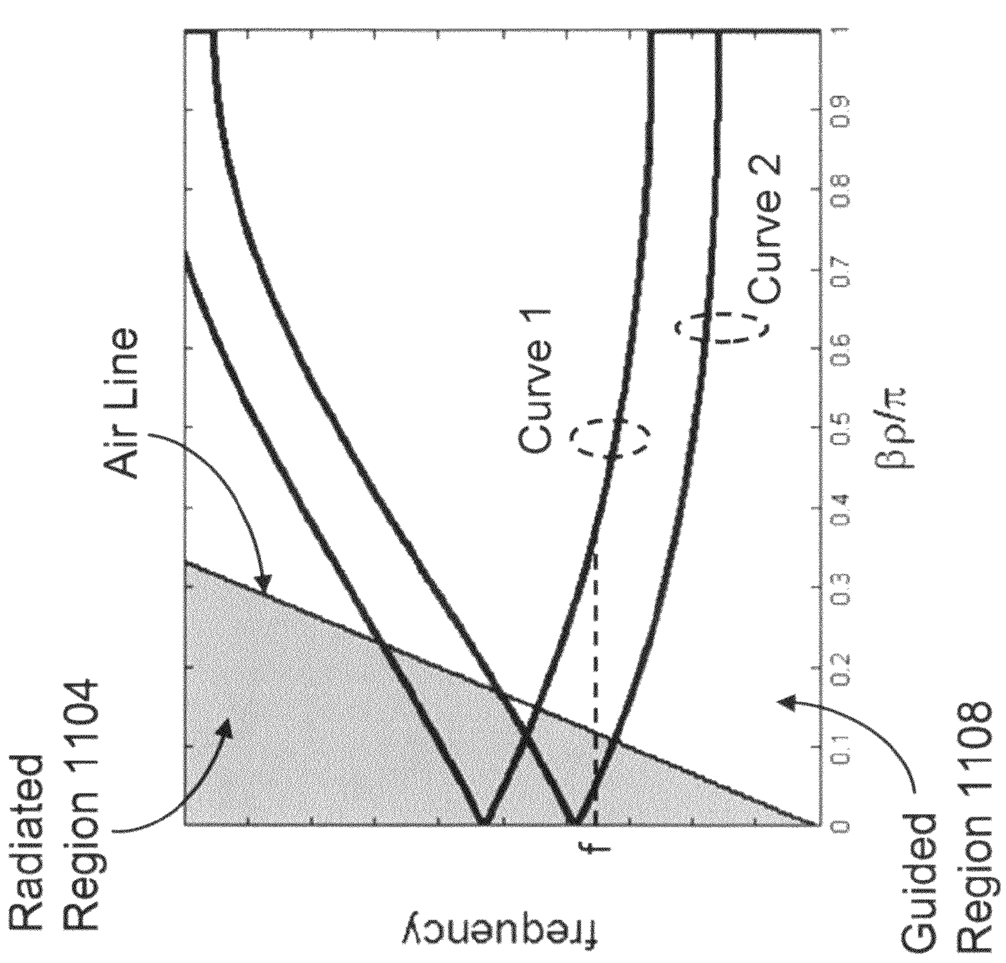
FIG. 11 shows schematic dispersion curves for the TDD application, where curves 1 and 2 represent the $CRLH_g$ and $CRLH_d$ dispersion curves, respectively, at one time or vice versa at a different time.

FIG. 11 shows schematic dispersion curves for the TDD application. Curves 1 and 2 represent the $CRLH_g$ and $CRLH_d$ dispersion curves, respectively, at one time or vice versa at a different time. For example, at time t1, the $CRLH_g$ MTM TL can be tuned to correspond to curve 1, and the $CRLH_d$ MTM TL can be tuned to correspond to curve 2. This indicates that, at the fixed frequency f, the $CRLH_g$ dispersion curve (curve 1) is in the guided region 1108, and the $CRLH_d$ dispersion curve (curve 2) is in the radiated region 1104, thereby operating as the TL and LWA, respectively. The $CRLH_g$ and $CRLH_d$ can be interchanged between curve 1 and curve 2 by using the tuning technique, thereby operating as the LWA and TL, respectively, at time t2.

Figure 12:
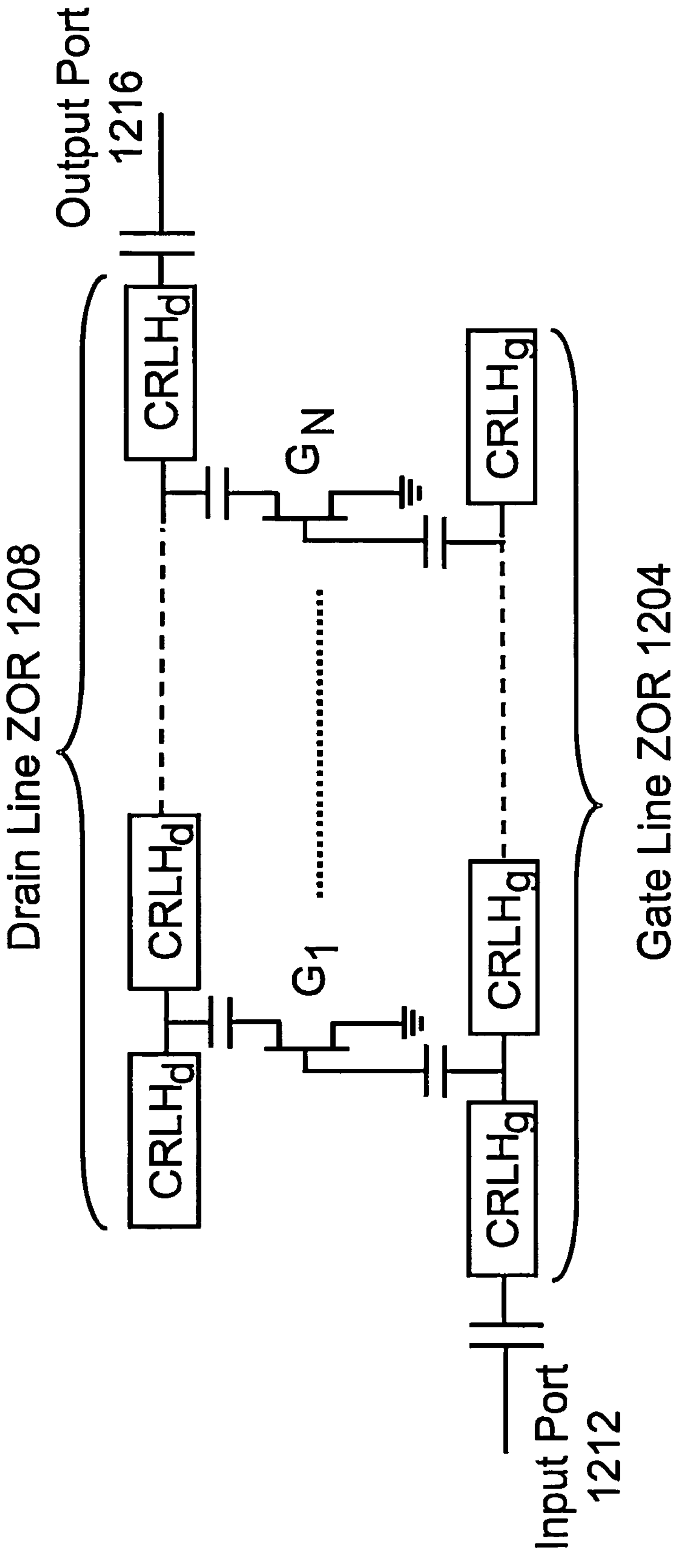
FIG. 12 shows an exemplary active MTM antenna system where a zeroth order resonator is used for each of the gate and drain lines for a FDD or TDD application.

A zeroth order resonator can be used to construct an active MTM antenna system for FDD and TDD applications. FIG. 12 shows an exemplary active MTM antenna system where the zeroth order resonator (ZOR) is used for each of the gate and drain lines, providing a uniform phase across the structure at the operation frequency. In FIG. 12, these two lines are denoted as gate line ZOR 1204 and drain line ZOR 1208. Different from the structures with the MTM TLs in FIGS. 6-7 and 9-10, the drain of each of the transistors, $G_1$, $G_2$, . . . , $G_N$, is capacitively coupled to the drain line ZOR 1208, and the gate of each of the transistors is also capacitively coupled to the gate line ZOR 1204. The input port 1212 is capacitively coupled to the gate line ZOR 1204 with the other end open, and the output port 1216 is capacitively coupled to the drain line ZOR 1208 at the operation frequency with the other end open, thereby providing the resonator functionality with less power dissipation than a TL. The $CRLH_d$ and $CRLH_g$ blocks can be made tunable or switchable depending on the application. Similar to the FDD case of using the MTM TLs shown in FIGS. 6-8, the dispersion curves associated with the gate line ZOR 1204 and drain line ZOR 1208 can be designed to correspond to the guided region and radiated region, respectively, at one frequency, and vice versa at another frequency. Furthermore, similar to the TDD case of using the MTM TLs shown in FIGS. 9-11, the dispersion curves associated with the gate line ZOR 1204 and drain line ZOR 1208 can be tuned to correspond to the guided region and radiated region, respectively, at one time, and vice versa at another time.

Another implementation of an active MTM antenna system for TDD applications can be realized by providing two different gate lines and two different drain lines. The two drain lines can be designed such that one is in the radiated region and the other is in the guided region at the operation frequency. Similarly, the two gate lines can be designed such that one is in the radiated region and the other is in the guided region at the operation frequency. In the transmit mode at t1, the gate line that is in the guided region is connected to the drain line that is in the radiated region. On the other hand, in the receive mode at t2, the gate line that is in the radiated region is connected to the drain line that is in the guided region.

Figure 13:
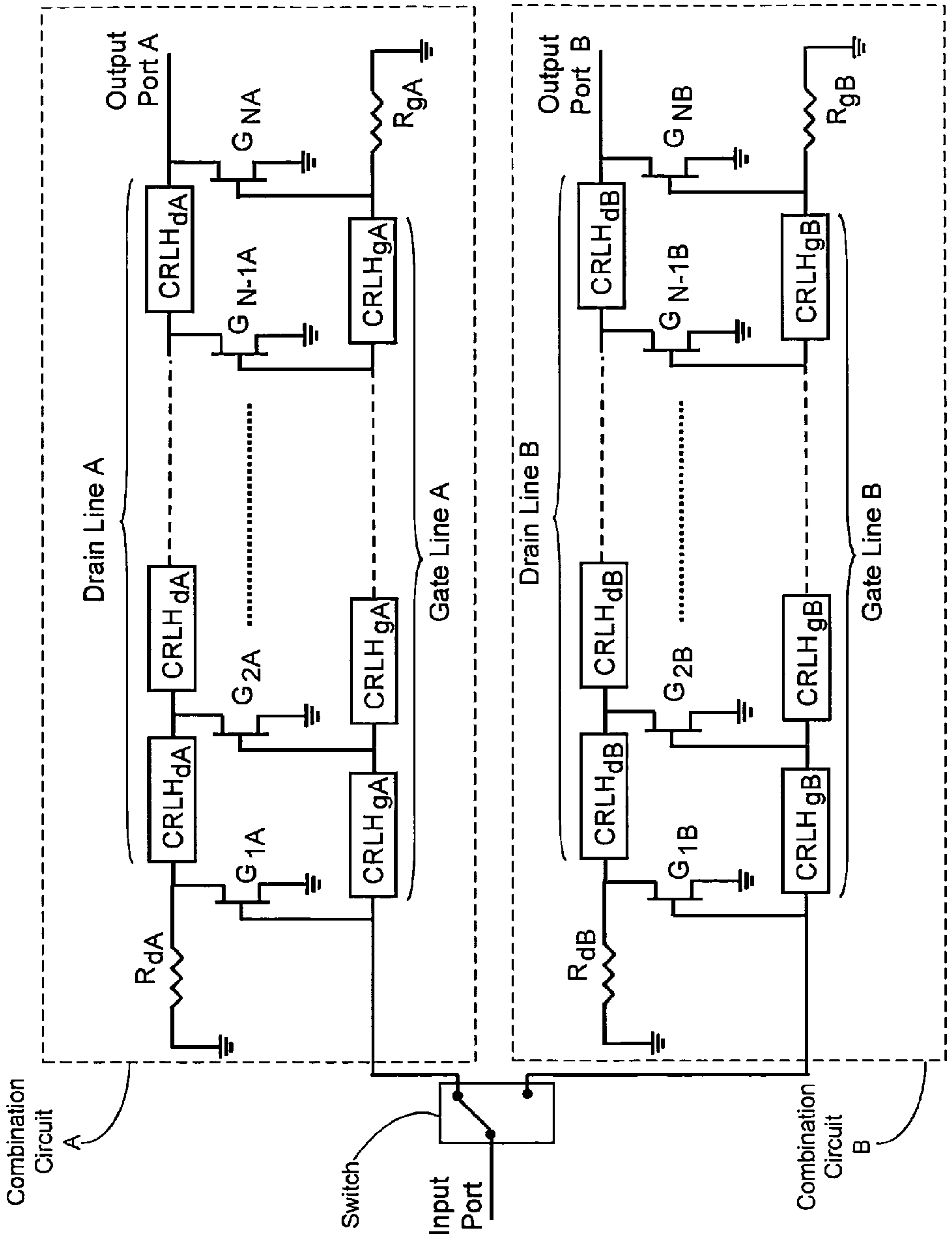
FIG. 13 shows an exemplary configuration for a dual-line active MTM antenna system, where a switch is provided at the input side to switch between the combinations A and B.

FIG. 13 shows one exemplary configuration for this dual-line active MTM antenna system. This system includes an input port to receive an input RF signal and a signal switch to direct the input RF signal to either one of two combination circuits A and B in two different circuit configurations.

The combination circuit A includes the drain line A and the gate line A connected to a first series of transistors G1A, G2A, . . . and GNA and the combination B includes the drain line B and the gate line B to a second series of transistors G1B, G2B, . . . and GNB. The switch is provided at the input side to switch between the combination circuits A and B in this example. The combination circuit A can be designed for the transmit mode and the combination circuit B can be designed for the receive mode, or vice versa. The switching between the transmit and receive modes can be made by a Single-Pole-Double-Throw (SPDT) switch, for example.

The design in FIG. 13 can be modified by having a single series of transistors to replace the two separate series of transistors. A reconfigurable connection is provided between the single series of transistors to the two MTM drain and gate lines A in the combination circuit A when the switch activates the combination circuit A or to the two MTM drain and gate lines B in the combination circuit B when the switch activates the combination circuit B. In some implementations, a zeroth order resonator can be used for each of the gate and drain lines with the aforementioned capacitive coupling scheme in the dual-line system.

As a specific example of the FDD application, the two different operating frequencies f1 and f2 may be selected to be 1.71 GHz and 2.11 GHz as the transmit and receive frequencies, respectively, for WCDMA applications. At 1.71 GHz, the gate line and drain line are designed to operate in the guided region and radiated region, respectively, for transmitting the signal as in FIG. 6. On the other hand, at 2.11 GHz, the gate and drain lines are designed to operate in the radiated region and guided region, respectively, for receiving the signal as in FIG. 7.

The design is made by adjusting the equivalent circuit parameters and choosing the number of unit cells N shown in FIG. 1. It should be noted that the parameter values are chosen so that the relationship of $$Z_C = \sqrt{\frac{L_R}{C_R}} = \sqrt{\frac{L_L}{C_L}} \quad \text{Eq. (5)}$$

is established to ensure that the CRLH unit cell is balanced, i.e., $L_R C_L = L_L C_R$ as in Eq. (3), where this CRLH block is matched to the characteristic impedance of $Z_C$ and is frequency independent. At the same time, the parameter values should be chosen to keep 1.71 GHz and 2.11 GHz in the passband which is bounded by the RH cutoff frequency and the LH cutoff frequency expressed as follows:

$$f_{cutoff,RH} \cong \frac{1}{\pi\sqrt{L_R C_R}} \quad \text{Eq. (6)}$$

$$f_{cutoff,LH} \cong \frac{1}{4\pi\sqrt{L_L C_L}}.$$

Figure 14:
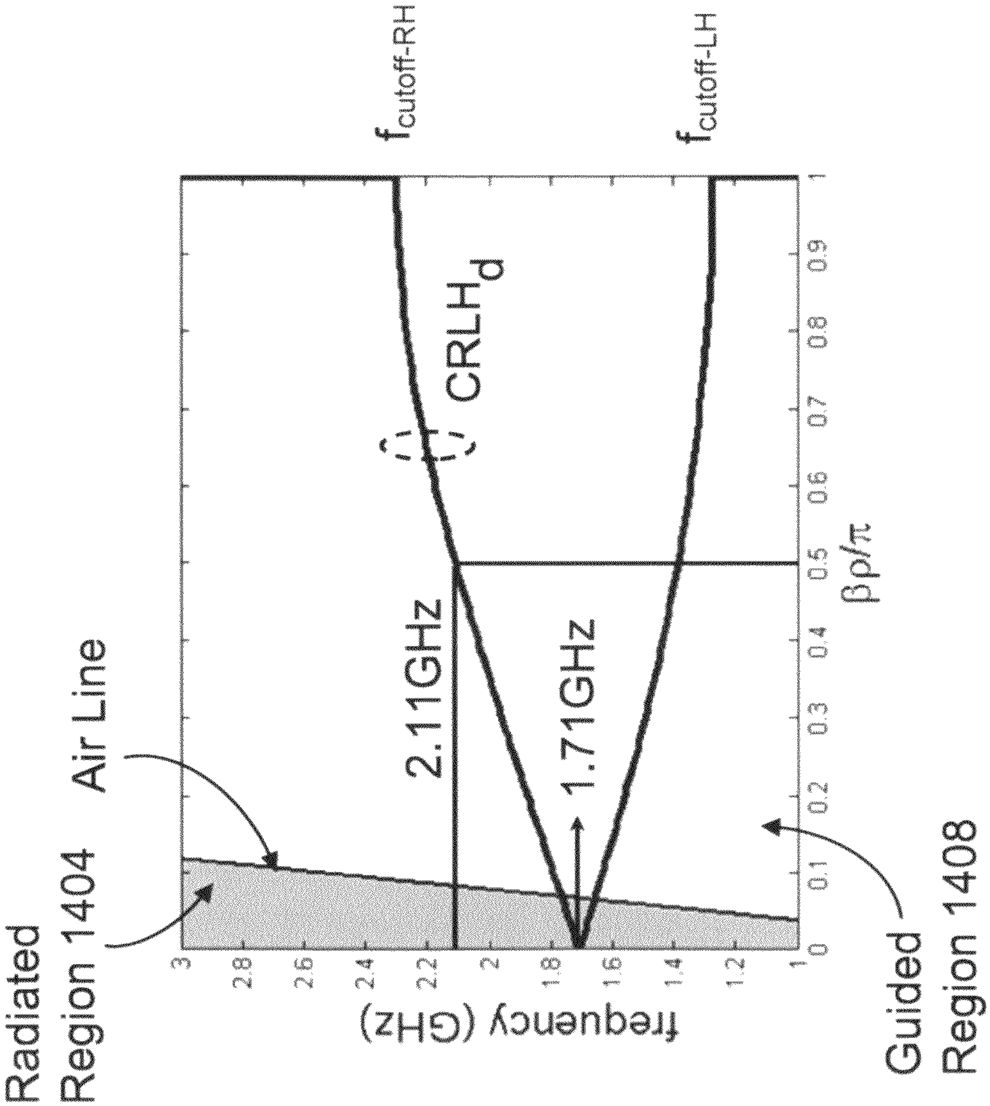
FIG. 14 shows the dispersion curve for the $CRLH_d$ MTM TL for the FDD application with parameter values of $L_R$=15.54 nH, $C_R$=6.21 pF, $L_L$=1.394 nH, $C_L$=0.5576 pF and N=4.

FIG. 14 shows the dispersion curve associated with the $CRLH_d$ unit cell for this FDD application with the following parameter values for $CRLH_d$ block design: $L_R$=15.54 nH, $C_R$=6.21 pF, $L_L$=1.394 nH, $C_L$=0.5576 pF and N=4. As can be seen from this figure, the drain line can operate as an LWA at 1.71 GHz because the dispersion curve is in the radiated region 1404 at this frequency. In addition, the broadside radiation pattern can be obtained due to the zero propagation constant at this frequency. This is achieved through the use of the balanced $CRLH_d$ unit cell, which provides the zero propagation constant at a non-DC frequency $\omega(\neq 0)$. At 2.11 GHz, the drain line operates as a TL because the dispersion curve is in the guided region 1408 at this frequency. The RH cutoff frequency $f_{cutoff\text{-}RH}$ shown in FIG. 14 is 2.3 GHz and the LH cutoff frequency $f_{cutoff\text{-}LH}$ is 1.27 GHz; thus, the operation frequencies, 1.71 GHz and 2.11 GHz, are well within the passband as required.

Figure 15:
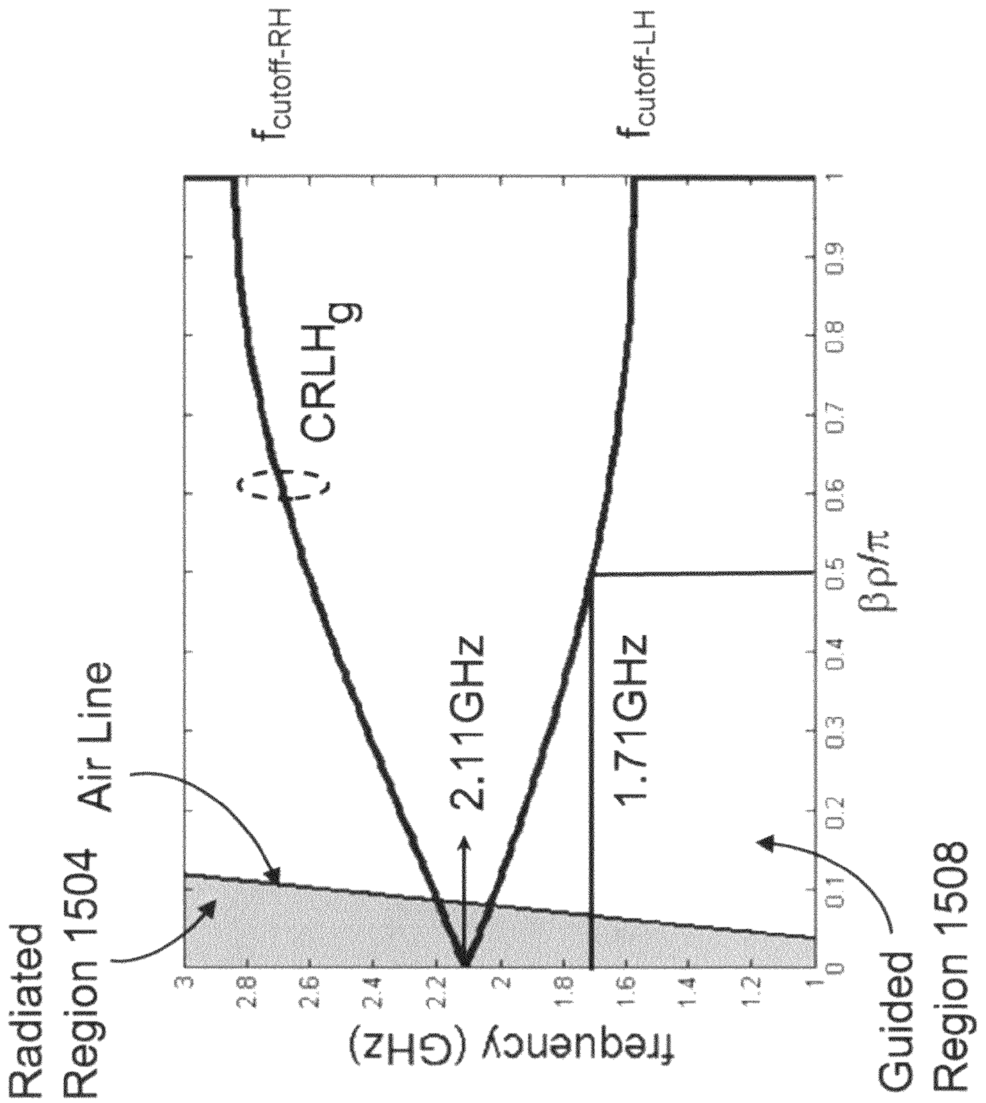
FIG. 15 shows the dispersion curve for the $CRLH_g$ MTM TL for the FDD application with these parameter values of $L_R$=12.58 nH, $C_R$=5.032 pF, $L_L$=1.13 nH, $C_L$=0.452 pF and N=4.

FIG. 15 shows the dispersion curve associated with the $CRLH_g$ unit cell for this FDD application with the following parameter values for the $CRLH_g$ design: $L_R$=12.58 nH, $C_R$=5.032 pF, $L_L$=1.13 nH, $C_L$=0.452 pF and N=4. At 2.11 GHz, the gate line can operate as an LWA because the dispersion curve is in the radiated region 1504 at this frequency. Moreover, the broadside radiation pattern can be obtained due to the zero propagation constant. This is achieved through the use of the balanced $CRLH_g$ unit cell, which provides the zero propagation constant at a non-DC frequency $\omega(\neq 0)$. At 1.71 GHz, the gate line operates as a TL because the dispersion curve is in the guided region 1508. The RH cutoff frequency $f_{cutoff\text{-}RH}$ shown in FIG. 15 is 2.48 GHz, and the LH cutoff frequency $f_{cutoff\text{-}LH}$ is 1.45 GHz; thus, the operation frequencies, 1.71 GHz and 2.11 GHz, are well within the passband as required.

Figure 16:
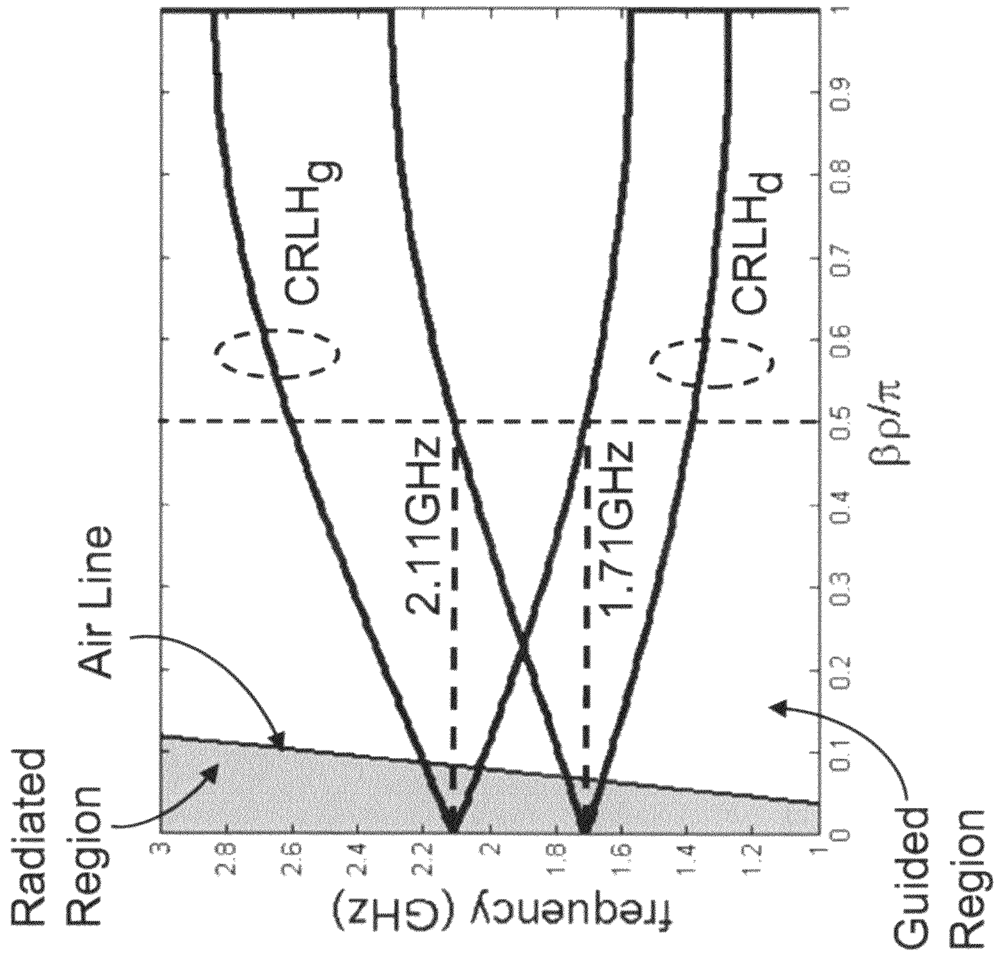
FIG. 16 shows the two dispersion curves corresponding to the $CRLH_d$ MTM TL in FIG. 14 and the $CRLH_g$ MTM TL in FIG. 15 for comparison.

FIG. 16 shows the two dispersion curves corresponding to the $CRLH_d$ unit cell in FIG. 14 and the $CRLH_g$ unit cell in FIG. 15 for comparison.

Figure 17:
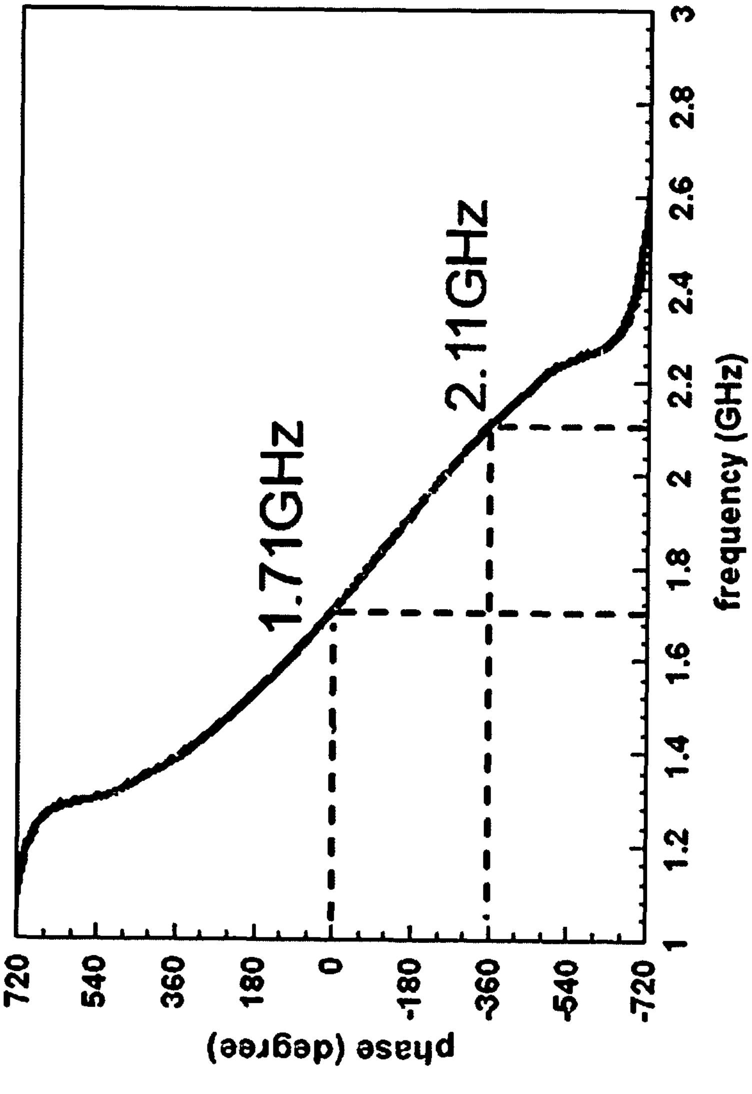
FIG. 17 shows simulation results of the phase as a function of frequency for the $CRLH_d$ MTM TL with the parameter values of $L_R$=15.54 nH, $C_R$=6.21 pF, $L_L$=1.394 nH, $C_L$=0.5576 pF and N=4.

FIG. 17 shows simulation results of the phase as a function of frequency for the $CRLH_d$ block. The above parameter values are chosen so that the phase at 1.71 GHz corresponds to 0°, and the phase at 2.11 GHz corresponds to −360°. At 2.11 GHz, one $CRLH_d$ unit cell provides the phase of −90° as seen in FIG. 14, where $\beta\rho/\pi$=0.5 and the phase is defined as $\phi=-\beta\rho$. Thus, the total phase for the present case of N=4 provides −360° as seen in FIG. 17.

Figure 18:
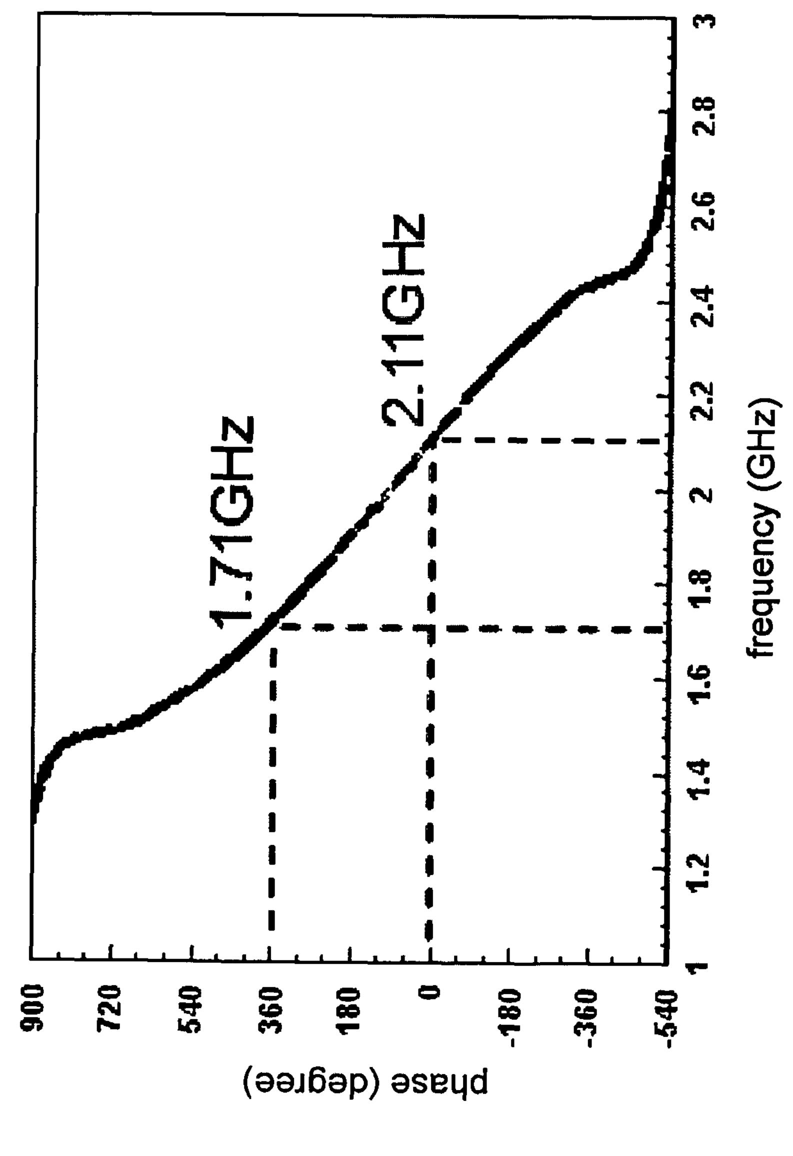
FIG. 18 shows simulation results of the phase as a function of frequency for the $CRLH_g$ MTM TL with the parameter values of $L_R$=12.58 nH, $C_R$=5.032 pF, $L_L$=1.13 nH, $C_L$=0.452 pF and N=4.

FIG. 18 shows simulation results of the phase as a function of frequency for the $CRLH_g$ block. The above parameter values are chosen so that the phase at 1.71 GHz corresponds to 360°, and the phase at 2.11 GHz corresponds to 0°. At 1.71 GHz, one $CRLH_g$ unit cell provides the phase of 90° as seen in FIG. 15, where $\beta\rho/\pi$=−0.5 and the phase is defined as $\phi=-\beta\rho$. (The negative sign for 0.5 indicates that the point is in the LH region.) Thus, the total phase for the present case of N=4 is 360° as seen in FIG. 18.

The selection of phases shown in FIGS. 17 and 18 is made to ensure the maximum possible power transfer to the output port at each operation frequency. In an example where all the transistors provide the same phase shift, all the $CRLH_g$ blocks are identical, and all the $CRLH_d$ blocks are identical, the difference between the phase associated with the $CRLH_g$ block and the phase associated with the $CRLH_d$ block can be chosen to be 360°×m, where m is an integer (m=0, ±1, ±2, . . . ), at the operation frequency f1 or f2, to ensure such maximum power transfer.

Figure 19:
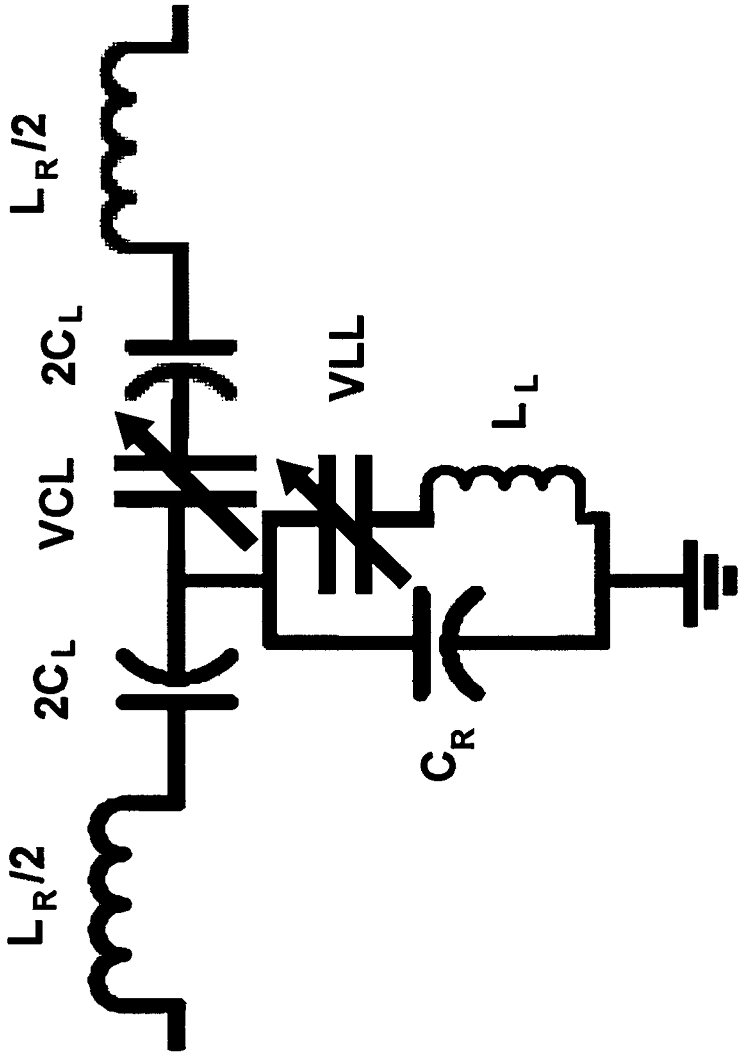
FIG. 19 shows the equivalent circuit for an exemplary active MTM antenna system for a TDD application using tunable circuits, where a varactor in series with $L_L$ and another varactor in series with $C_L$ are introduced.

As a specific example of the TDD application, the operation frequency is chosen to be 1.71 GHz for GSM-1800 applications. Instead of two different MTM TLs as in the FDD case, only one MTM TL can be designed in the TDD case. A tuning technique is used here when applying the MTM TL to the drain line or gate line. As shown in FIG. 11, the $CRLH_d$ and $CRLH_g$ MTM TLs (blocks) can be interchanged between the TL and LWA operations. One way to achieve this is to introduce a varactor in series with $L_L$ and another varactor in series with $C_L$ as tuning elements. FIG. 19 shows the equivalent circuit for this case, where the varactor in series with $C_L$ is denoted as VCL, and the varactor in series with $L_L$ is denoted as VLL. Each varactor in this example has two states which are state 1 and state 2, and has a larger capacitance value in state 1 than in state 2. Thus, the effective $C_L$ including the varactor capacitance added in series with the original $C_L$ is larger with state 1 than with state 2. When the varactor capacitance is large, the equivalent varactor inductance is small in absolute value but with a negative sign. Thus, the effective $L_L$ including the varactor inductance added in series with the original $L_L$ is larger with state 1 than with state 2. Switching between states 1 and 2 of the varactors can be achieved in response to control signals from a control circuit included in the system.

In order to maintain the balanced condition, the relationship expressed as in Eq. (5) should be satisfied, where the CRLH block is matched to the characteristic impedance of $Z_C$ and is frequency independent. This relationship in Eq. (5) indicates that both $C_L$ and $L_L$ need to increase or decrease at the same time. In addition, the operation frequencies should be within the range bounded by the cutoff frequencies defined by Eq. (6) to be in the passband.

Figure 20:
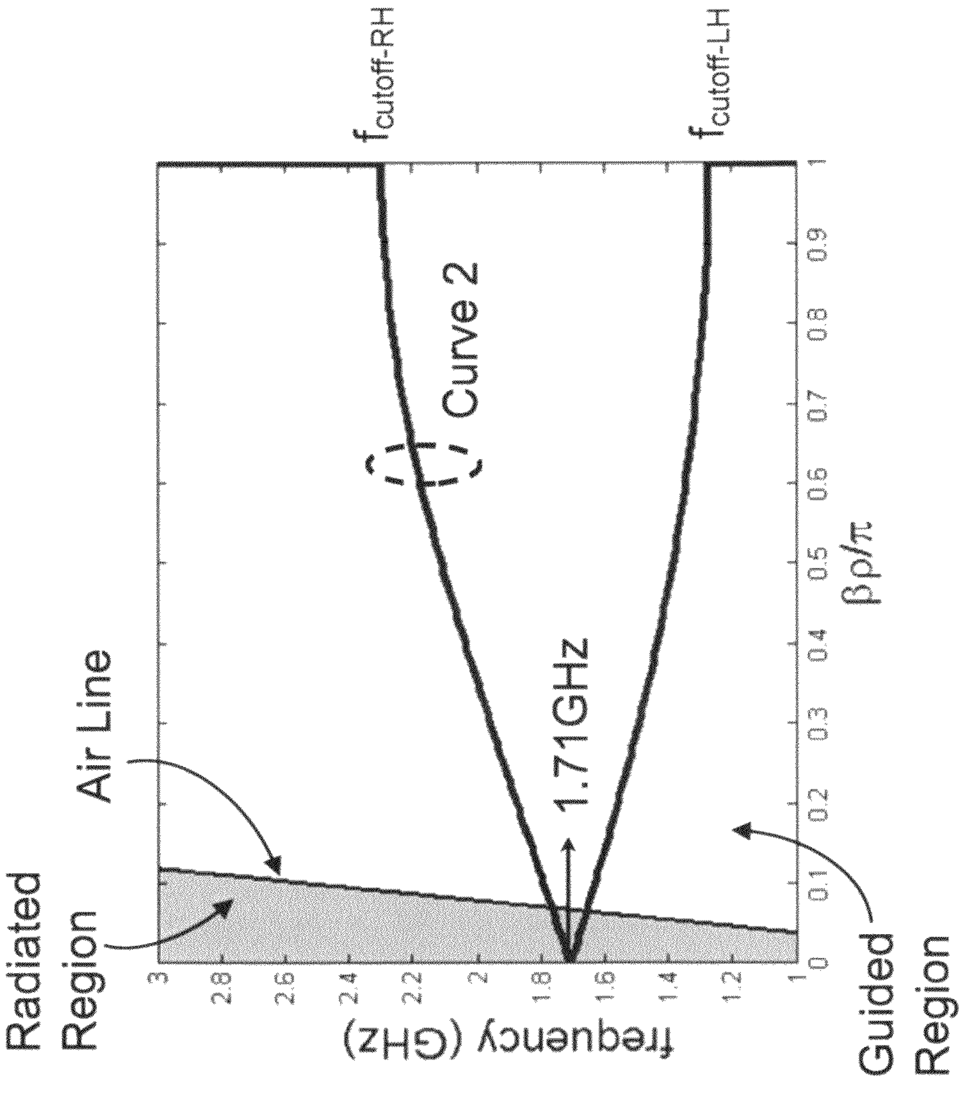
FIG. 20 shows the dispersion curve, denoted as curve 2, for the case of VCL in state 2 and VLL in state 2 providing the parameter values of $L_R$=15.54 nH, $C_R$=6.21 pF, $L_L$=1.394 nH, $C_L$=0.5576 pF and N=4.

In one design example of the MTM TL operating as an LWA, the parameter values of $L_R$=15.54 nH, $C_R$=6.21 pF, $L_L$=1.394 nH, $C_L$=0.5576 pF and N=4 are used. In this case both VCL and VLL are in state 2. Here, $C_L$ represents the effective capacitance including the effect arising from the varactor VCL that is in series with the original $C_L$; and $L_L$ represents the effective $L_L$ including the effect arising from the varactor VLL that is in series with the original $L_L$. Note that the conditions in Eq. (5) are met with the above parameter values. FIG. 20 shows the dispersion curve, denoted as curve 2, for the case of VCL in state 2 and VLL in state 2 providing the above parameter values. It can be seen from this figure that the point at 1.71 GHz of curve 2 is in the radiated region, and thus the MTM TL operates as a LWA at this frequency. The broadside radiation pattern can be obtained due to the zero propagation constant at 1.71 GHz. This is achieved through the use of the balanced unit cell, which provides the zero propagation constant at a non-DC frequency ω(≠0). The RH cutoff frequency $f_{cutoff\text{-}RH}$ shown in FIG. 20 is 2.3 GHz and the LH cutoff frequency $f_{cutoff\text{-}LH}$ is 1.27 GHz. Thus, the operation frequency 1.71 GHz is well within the passband as required.

By using the same design as above but changing the varactors VCL and VLL to state 1, the MTM TL can be made to operate as a TL, where the parameter values of $L_R$=15.54 nH, $C_R$=6.21 pF, $L_L$=2.417 nH, $C_L$=0.9668 pF and N=4 are used for this case. These $C_L$ and $L_L$ values are the effective values including the varactor contributions and are larger with state 1 than with state 2. As can be seen qualitatively from Eq. (2), for example, the dispersion curve moves up in frequency when $C_L$ and/or $L_L$ decrease and moves down in frequency when $C_L$ and/or $L_L$ increase.

Figure 21:
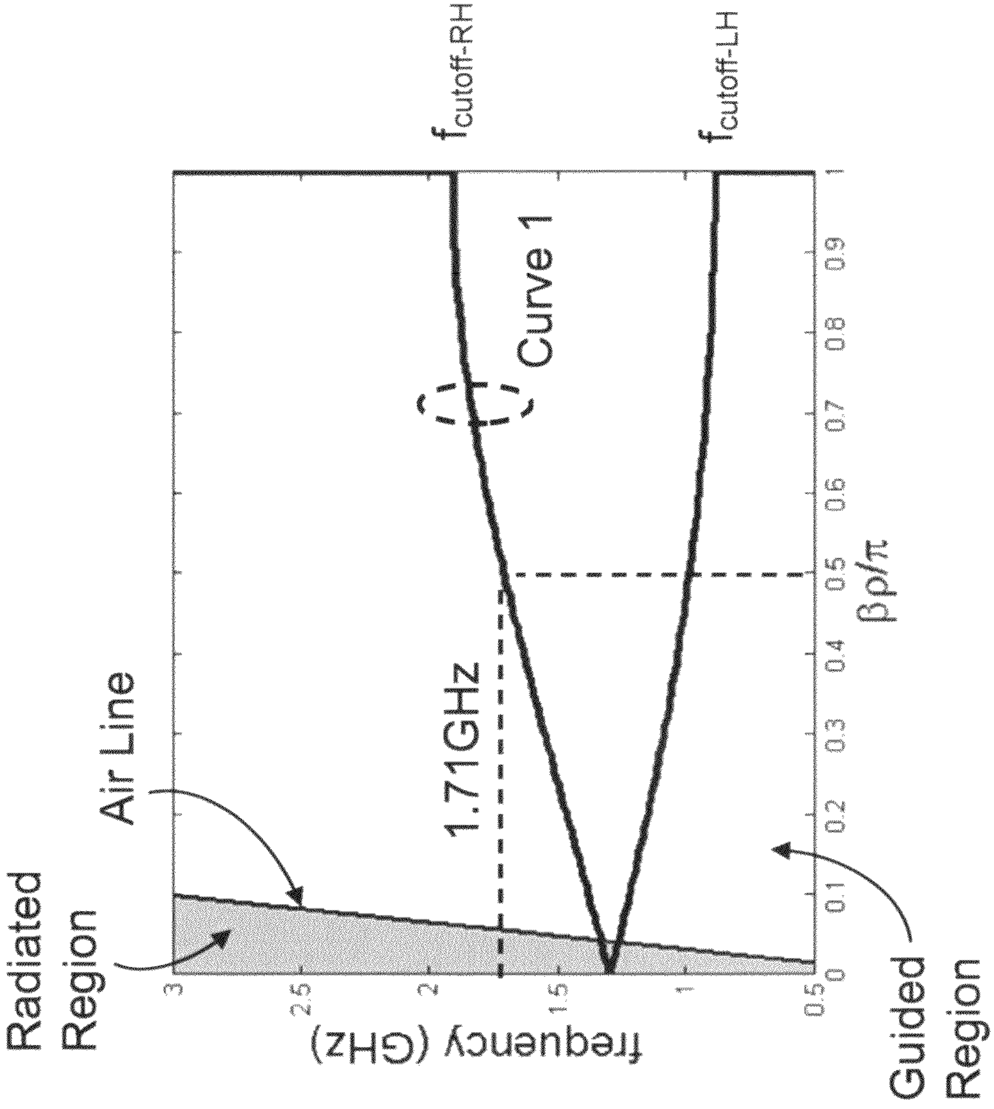
FIG. 21 shows the dispersion curve, denoted as curve 1, for the case of VCL in state 1 and VLL in state 1 providing the parameter values of $L_R$=15.54 nH, $C_R$=6.21 pF, $L_L$=2.417 nH, $C_L$=0.9668 pF and N=4.

FIG. 21 shows the dispersion curve, denoted as curve 1, for the case of VCL in state 1 and VLL in state 1 providing the above parameter values. Curve 2 is higher in frequency than curve 1 due to the lower $C_L$ and $L_L$ values with state 2 than with state 1. It can be seen from this figure that the point at 1.71 GHz of curve 1 is in the guided region, and thus the MTM TL operates as a TL at this frequency. The RH cutoff frequency $f_{cutoff\text{-}RH}$ shown in FIG. 21 is 1.91 GHz and the LH cutoff frequency $f_{cutoff\text{-}LH}$ is 0.88 GHz. Thus, the operation frequency 1.71 GHz is well within the passband as required.

Figure 22:
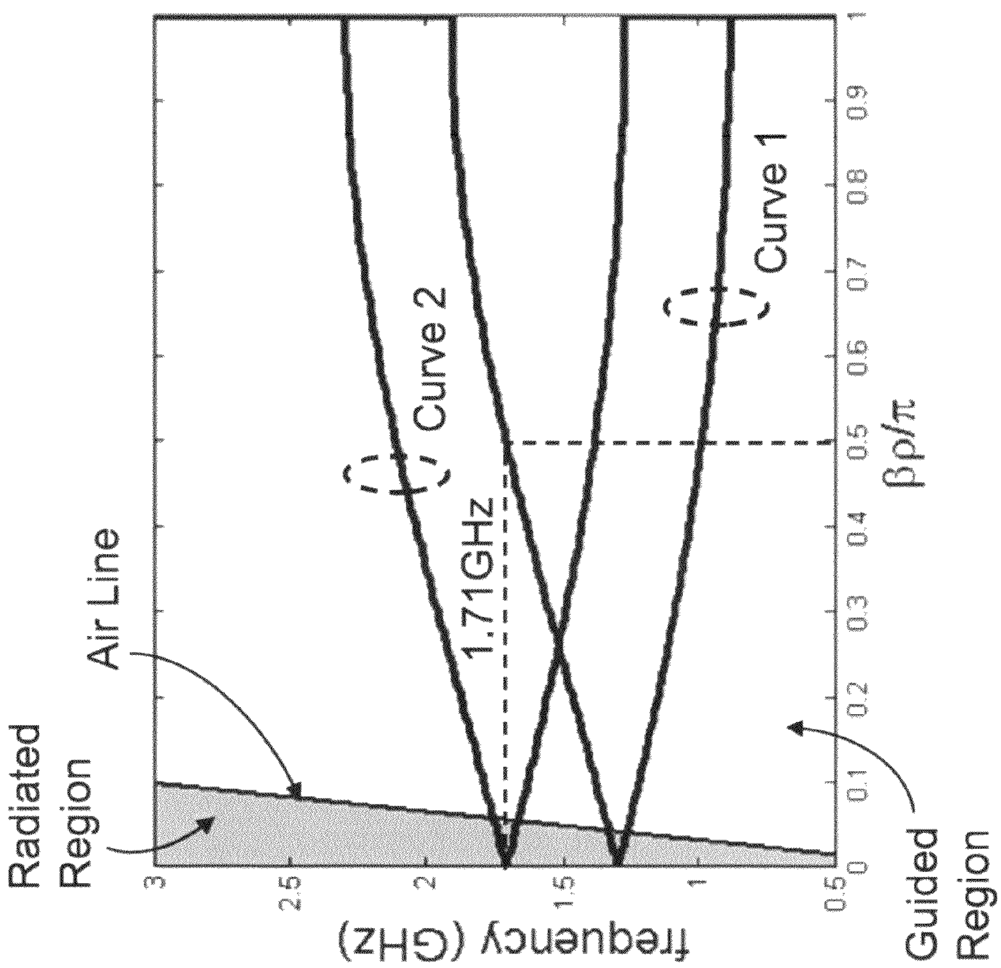
FIG. 22 shows the two different dispersion curves, curve 2 in FIG. 20 and curve 1 in FIG. 21.

FIG. 22 plots the two different dispersion curves corresponding to the MTM TL with the varactors VCL and VLL being in state 1, shown in FIG. 21 and denoted as curve 1, and to the MTM TL with the varactors VCL and VLL being in state 2, shown in FIG. 20 and denoted as curve 2. As can be seen from this figure, at the operation frequency 1.71 GHZ, the MTM TL can switch between curve 1 that provides the TL characteristics and curve 2 that provides the LWA characteristics through the use of the varactors that can be switched between state 1 and state 2. Therefore, the drain line and gate line can be tuned to correspond to the LWA and TL, respectively, at time t1, and to the TL and LWA, respectively, at different time t2, as shown in FIG. 11.

Figure 23:
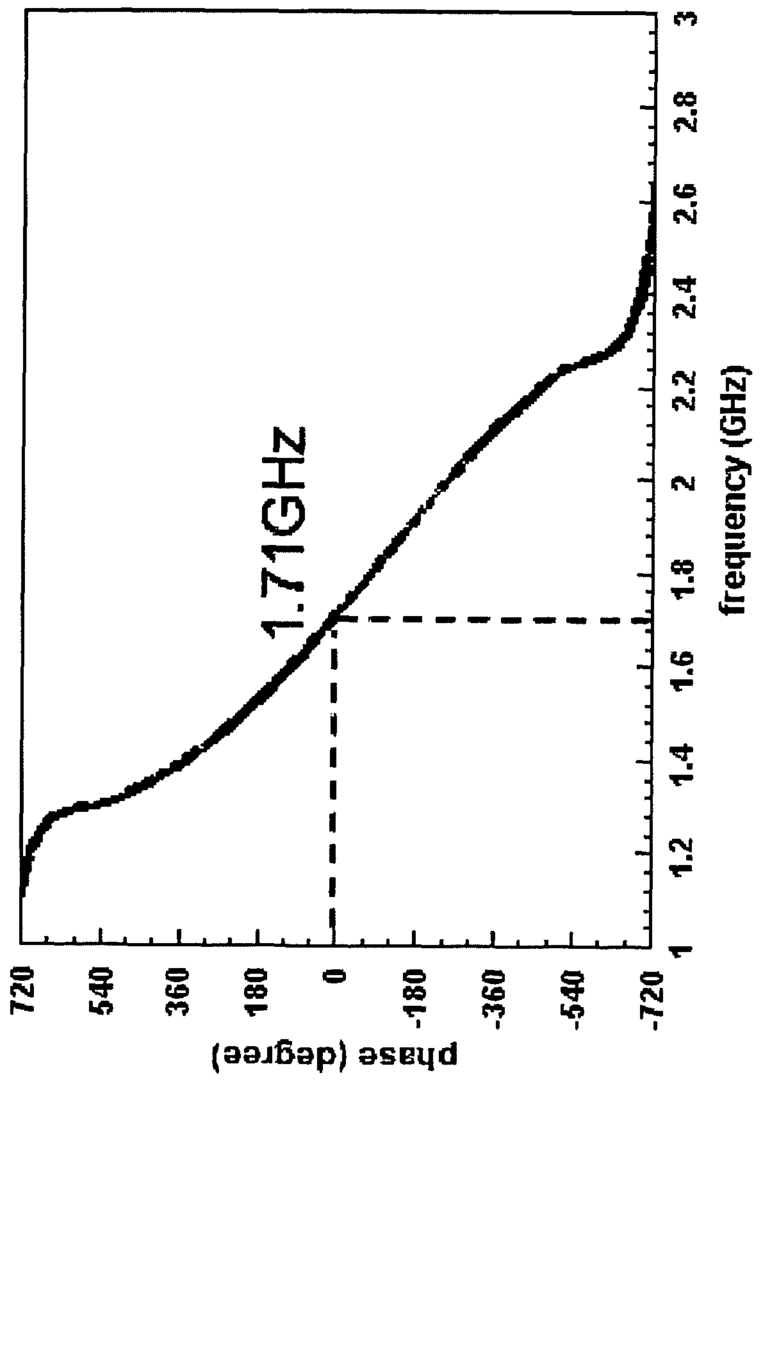
FIG. 23 shows simulation results of the phase as a function of frequency for the MTM TL with the parameter values for the case of VCL and VLL being in state 2.

FIG. 23 shows simulation results of the phase as a function of frequency for the MTM TL with the parameter values for the case of VCL and VLL being in state 2. These above parameter values are chosen so that the phase at 1.71 GHz corresponds to 0°.

Figure 24:
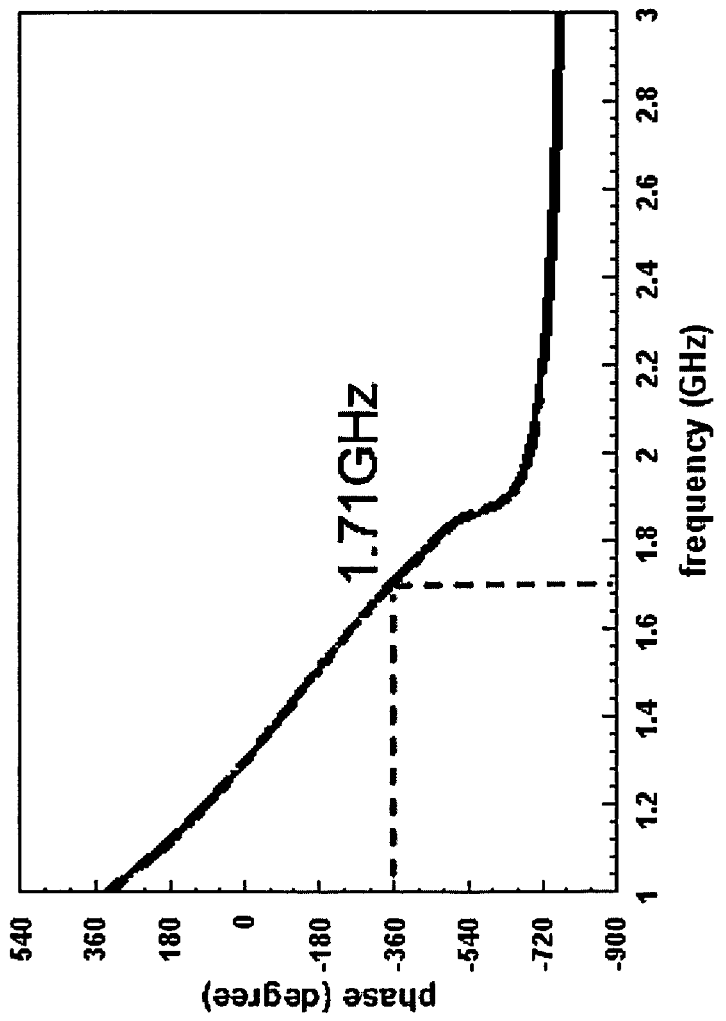
FIG. 24 shows simulation results of the phase as a function of frequency for the MTM TL with the parameter values for the case of VCL and VLL being in state 1.

FIG. 24 shows simulation results of the phase as a function of frequency for the MTM TL with the parameter values for the case of VCL and VLL being in state 1. The above parameter values are chosen so that the phase at 1.71 GHz corresponds to −360°. At 1.71 GHz, one CRLH unit cell provides the phase of −90° as seen in FIG. 21, where $\beta\rho/\pi$=0.5 and the phase is defined as $\phi=-\beta\rho$. Thus, the total phase for the present case of N=4 provides −360° as seen in FIG. 24.

The selection of phases shown in FIGS. 23 and 24 is made to ensure the maximum possible power transfer to the output port at the operation frequency. In an example where all the transistors provide the same phase shift, all the $CRLH_g$ blocks are identical, and all the $CRLH_d$ blocks are identical, the difference between the phase associated with the state 1 and the phase associated with the state 2 can be chosen to be 360°×m, where m is an integer (m=0, ±1, ±2, . . . ), at the operation frequency, to ensure such maximum power transfer.

The use of varactors represents one example of a tuning scheme for TDD applications. Another tuning scheme can be employed for the purpose of providing different equivalent circuit parameter values for obtaining different dispersion curves. Adjustments of the parameters $C_L$ and $L_L$ are considered above with the use of varactors, but other parameters ($C_R$ and/or $L_R$) can also be adjusted for moving the dispersion curve up or down depending on the underlying TDD application. An example of different type of tuning scheme may involve changing electrical lengths of one or more parts (distributed circuit elements) of the structure such as the interdigital capacitor, shorted stub, top patch, and via shown in FIGS. 3 and 4. Changing the electrical length of any of these parts results in changing the corresponding equivalent circuit parameter value shown in FIGS. 1, 2(*a*)-2(*e*). For example, an additional via segment can be prefabricated on the substrate, and an active component such as a PIN diode or SPDT switch can be used to connect or disconnect the additional via segment to the original via, thereby changing the via line electrical length to obtain two different states corresponding to one $L_L$ value and another $L_L$ value, resulting in two different dispersion curves.

Figure 25A:
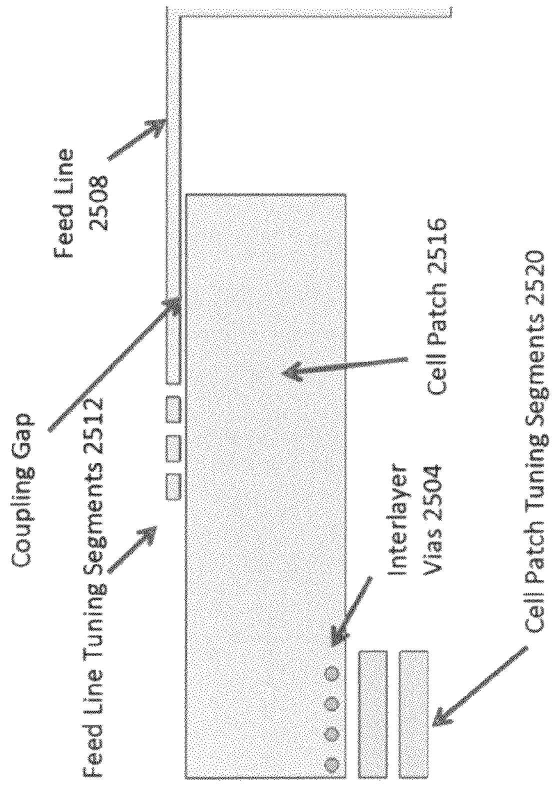
FIGS. 25(*a*) and 25(*b*) show an example of a MTM structure with prefabricated additional segments for the tuning the MTM structure.
Figure 25B:
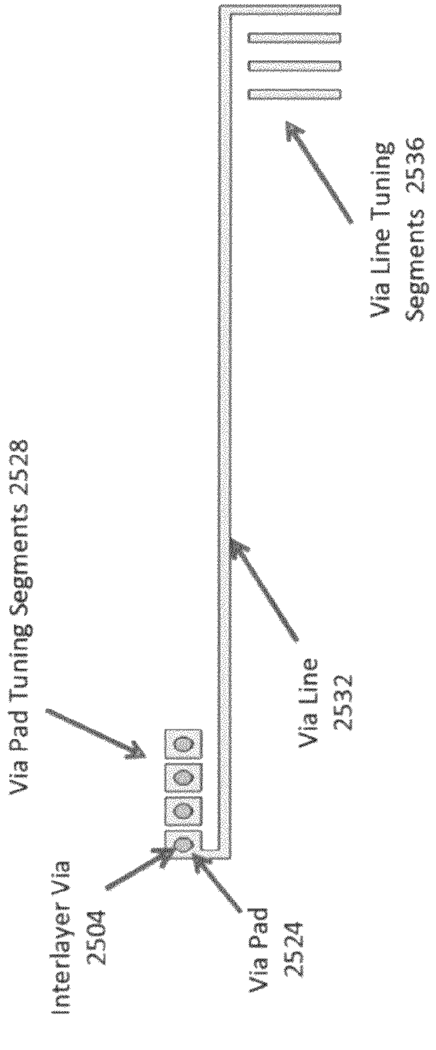

FIGS. 25(*a*) and 25(*b*) show an example of a MTM structure with prefabricated additional segments for the tuning scheme, illustrating the top view of the top metallization layer and top view of the bottom metallization layer, respectively. The interlayer vias 2504 connect these two layers formed on two different surfaces of a substrate. The top metallization layer includes a feed line 2508 with feed line tuning segments 2512 and a cell patch 2516 with cell patch tuning segments 2520. The bottom metallization layer includes a via pad 2524 with via pad tuning segments 2528 and a via line 2532 with via line tuning segments 2536. Connecting one or more of the tuning segments to the corresponding element effectively change the length, size and/or shape of the element, thereby changing the corresponding equivalent circuit parameter and the dispersion curve. Circuit switches can be used to connect tuning segments to tune circuit parameters.

Another example of a tunable unit cell includes a varactor replacing the $C_L$ and an variable inductor replacing $L_L$. Yet another example includes a gyrator (impedance inverter) replacing the $L_L$.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described and illustrated in this document.

What is claimed is:

1. An antenna system for frequency division duplex (FDD) based on a composite right and left handed (CRLH) metamaterial (MTM) structure, comprising:

- a first MTM transmission line comprising a plurality of first CRLH blocks, each first CRLH block comprising at least one first CRLH unit cell, the first MTM transmission line configured to operate as a first transmission line that guides a signal at a first frequency and to operate as a first leaky wave antenna that receives a signal at a second frequency;
- a second MTM transmission line comprising a plurality of second CRLH blocks, each second CRLH block comprising at least one second CRLH unit cell, the second MTM transmission line configured to operate as a second transmission line that guides a signal at the second frequency and to operate as a second leaky wave antenna that transmits a signal at the first frequency; and
- a plurality of transistors coupled to the first and second MTM transmission lines, each transistor having a first terminal coupled to the first MTM transmission line and a second terminal coupled to the second MTM transmission line.

2. The antenna system for FDD based on the CRLH MTM structure as in claim 1, wherein

- the first CRLH unit cell is configured to have a first dispersion curve that includes a point in a guided region at the first frequency, and another point in a radiated region at the second frequency; and
- the second CRLH unit cell is configured to have a second dispersion curve that includes a point in the radiated region at the first frequency, and another point in the guided region at the second frequency.

3. The antenna system for FDD based on the CRLH MTM structure as in claim 1, wherein

- the first CRLH unit cell is configured to be balanced; and
- the second CRLH unit cell is configured to be balanced.

4. The antenna system for FDD based on the CRLH MTM structure as in claim 3, wherein

- the first dispersion curve includes a point where a propagation constant is substantially zero at the second frequency, enabling the first leaky wave antenna to generate broadside radiation; and
- the second dispersion curve includes a point where the propagation constant is substantially zero at the first frequency, enabling the second leaky wave antenna to generate broadside radiation.

5. The antenna system for FDD based on the CRLH MTM structure as in claim 2, wherein each of the at least one first CRLH unit cell and the at least one second CRLH unit cell comprises a series right-handed (RH) inductor, a series left-handed (LH) capacitor, a shunt LH inductor, and a shunt RH capacitor, which provides first equivalent circuit parameters for the first CRLH unit cell determining the first dispersion curve, and second equivalent circuit parameters for the second CRLH unit cell determining the second dispersion curve.

6. The antenna system for FDD based on the CRLH MTM structure as in claim 5, wherein

- the first equivalent circuit parameters and a number of the first CRLH unit cells in each of the first CRLH blocks are determined to have a phase across the first CRLH block to be $\phi_1$, and the second equivalent circuit parameters and a number of the second CRLH unit cells in each of the second CRLH blocks are determined to have a phase across the second CRLH block to be $\phi_2$, such that a difference between $\phi_1$ and $\phi_2$ is 360 degrees times an integer.

7. The antenna system for FDD based on the CRLH MTM structure as in claim 1, wherein

- the first MTM transmission line is configured as a first zeroth order resonator having an open circuited first end and a second end capacitively coupled to an input port;
- the second MTM transmission line is configured as a second zeroth order resonator having an open circuited third end and a fourth end capacitively coupled to an output port; and
- the first terminal of each of transistors is capacitively coupled to the first MTM transmission line and the second terminal of each of the transistors is capacitively coupled to the second MTM transmission line.

8. An antenna system for time division duplex (TDD) based on a composite right and left handed (CRLH) metamaterial (MTM) structure, comprising:

- a first MTM transmission line comprising a plurality of first tunable CRLH blocks, each first tunable CRLH block comprising at least one CRLH unit cell, the first tunable CRLH blocks configured to tune the first MTM transmission line to operate as a first transmission line that guides a signal at a frequency during a first time period and to tune the first MTM transmission line to operate as a first leaky wave antenna that receives a signal at the frequency during a second time period;

a second MTM transmission line comprising a plurality of second tunable CRLH blocks, each second tunable CRLH block comprising at least one CRLH unit cell, the second tunable CRLH blocks configured to tune the second MTM transmission line to operate as a second transmission line that guides a signal at the frequency during the second time period and to tune the second MTM transmission line to operate as a second leaky wave antenna that transmits a signal at the frequency during the first time period; and a plurality of transistors coupled to the first and second MTM transmission lines, each transistor having a first terminal coupled to the first MTM transmission line and a second terminal coupled to the second MTM transmission line.

9. The antenna system for TDD based on the CRLH MTM structure as in claim 8, wherein each of the CRLH unit cells in the first and second MTM transmission lines is configured to have a first state or a second state, the first state corresponding to a first dispersion curve and the second state corresponding to a second dispersion curve; and wherein the first dispersion curve includes a point in a guided region at the frequency, and the second dispersion curve includes a point in a radiated region at the frequency.

10. The antenna system for TDD based on the CRLH MTM structure as in claim 9, further comprising a control circuit to tune each of the first and second tunable CRLH blocks, wherein the control circuit sends a first control signal to the at least one CRLH unit cell in each of the first tunable CRLH blocks to be tuned to the first state, and a second control signal to the at least one CRLH unit cell in each of the second tunable CRLH blocks to be tuned to the second state during the first time period, and the control circuit sends a third control signal to the at least one CRLH unit cell in each of the first tunable CRLH blocks to be tuned to the second state, and a fourth control signal to the at least one CRLH unit cell in each of the second tunable CRLH blocks to be tuned to the first state during the second time period.

11. The antenna system for TDD based on the CRLH MTM structure as in claim 8, wherein each of the CRLH unit cells in the first and second MTM transmission lines is configured to be balanced.

12. The antenna system for TDD based on the CRLH MTM structure as in claim 11, wherein the second dispersion curve includes a point where a propagation constant is substantially zero at the frequency for providing broadside radiation.

13. The antenna system for TDD based on the CRLH MTM structure as in claim 9, wherein each of the CRLH unit cells in the first and second MTM transmission lines comprises a series right-handed (RH) inductor, a series left-handed (LH) capacitor, a shunt LH inductor, a shunt RH capacitor, a first varactor in series with the series LH capacitor, and a second varactor in series with the shunt LH inductor, which provide equivalent circuit parameters, wherein the first and second varactors are used to tune the CRLH unit cell to the first state or to the second state.

14. The antenna system for TDD based on the CRLH MTM structure as in claim 9, wherein each of the CRLH unit cells in the first and second MTM transmission lines comprises a series right-handed (RH) inductor, a series varactor, a shunt variable inductor, and a shunt RH capacitor, which provide equivalent circuit parameters, wherein the series varactor and the shunt variable inductor are used to tune the CRLH unit cell to the first state or to the second state.

15. The antenna system for TDD based on the CRLH MTM structure as in claim 9, wherein each of the CRLH unit cells in the first and second MTM transmission lines comprises a series right-handed (RH) inductor, a series varactor, and a shunt gyrator, and a shunt RH capacitor, which provide equivalent circuit parameters, wherein the series varactor and the shunt gyrator are used to tune the CRLH unit cell to the first state or to the second state.

16. The antenna system for TDD based on the CRLH MTM structure as in claim 13, wherein the equivalent circuit parameters and a number of the CRLH unit cells in each of the first and second tunable CRLH blocks are determined to have a phase across each of the first and second tunable CRLH blocks for the first state to be $\phi_1$ and a phase across each of the first and second tunable CRLH blocks for the second state to be $\phi_2$, such that a difference between $\phi_1$ and $\phi_2$ is 360 degrees times an integer.

17. The antenna system for TDD based on the CRLH MTM structure as in claim 8, wherein the first MTM transmission line is configured as a first zeroth order resonator having an open circuited first end and a second end capacitively coupled to an input port;

the second MTM transmission line is configured as a second zeroth order resonator having an open circuited third end and a fourth end capacitively coupled to an output port; and the first terminal of each of the transistors is capacitively coupled to the first MTM transmission line and the second terminal of each of the transistors is capacitively coupled to the second MTM transmission line.

18. The antenna system for TDD based on the CRLH MTM structure as in claim 8, wherein the CRLH unit cell comprises distributed circuit elements and conductive segments that are formed separately from the distributed circuit elements, wherein an electrical length of each of the distributed circuit elements can be changed by coupling and decoupling the conductive segment using a switch to provide different states corresponding to different dispersion curves.

19. An antenna system for time division duplex (TDD) based on a composite right and left handed (CRLH) metamaterial (MTM) structure, comprising:

a first MTM transmission line comprising a plurality of first CRLH blocks, each first CRLH block comprising at least one first CRLH unit cell, the first MTM transmission line configured to operate as a first transmission line that guides a signal at a frequency;

a second MTM transmission line comprising a plurality of second CRLH blocks, each second CRLH block comprising at least one second CRLH unit cell, the second MTM transmission line configured to operate as a first leaky wave antenna that receives a signal at the frequency;

a third MTM transmission line comprising a plurality of third CRLH blocks, each third CRLH block comprising at least one third CRLH unit cell, the third MTM transmission line configured to operate as a second leaky wave antenna that transmits a signal at the frequency;

a fourth MTM transmission line comprising a plurality of fourth CRLH blocks, each fourth CRLH block comprising at least one fourth CRLH unit cell, the fourth MTM transmission line configured to operate as a second transmission line that guides a signal at the frequency;

a switch for activating the first and third MTM transmission lines during a transmit time period and the second and fourth MTM transmission lines during a receive time period;

a first plurality of transistors coupled to the first and third MTM transmission lines; and a second plurality of transistors coupled to the second and fourth MTM transmission lines;

wherein the first CRLH unit cell is configured to have a first dispersion curve that includes a point in a guided region at the frequency;

the second CRLH unit cell is configured to have a second dispersion curve that includes a point in a radiated region at the frequency;

the third CRLH unit cell is configured to have a third dispersion curve that includes a point in the radiated region at the frequency; and the fourth CRLH unit cell is configured to have a fourth dispersion curve that includes a point in a guided region at the frequency.

20. The antenna system for TDD based on a CRLH MTM structure as in claim 19, wherein each of the first, second, third and fourth MTM transmission line is configured as a zeroth order resonator that is capacitively coupled to the first or second plurality of transistors.

21. The antenna system for TDD based on a CRLH MTM structure as in claim 19, comprising a series of transistors that are coupled to the first and third MTM transmission lines to operate as the first plurality of transistors during the transmit time period, and to the second and fourth MTM transmission lines to operate as the second plurality of transistors during the receive time period.

22. A method for processing signals for frequency division duplex (FDD) based on a composite right and left handed (CRLH) metamaterial (MTM) structure, comprising steps of:

configuring a first MTM transmission line to operate as a first transmission line that guides a signal at a first frequency and to operate as a first leaky wave antenna that receives a signal at a second frequency;

configuring a second MTM transmission line to operate as a second transmission line that guides a signal at the second frequency and to operate as a second leaky wave antenna that transmits a signal at the first frequency;

coupling a plurality of transistors to the first and second MTM transmission lines by coupling a first terminal of each transistor to the first MTM transmission line and a second terminal of each transistor to the second MTM transmission line;

receiving a first signal at the first frequency at an input port;

guiding the first signal through the first MTM transmission line which operates as the first transmission line at the first frequency;

amplifying the first signal by using the plurality of transistors;

transmitting the first signal through the second MTM transmission line which operates as the second leaky wave antenna at the first frequency;

receiving a second signal at the second frequency through the first MTM transmission line which operates as the first leaky wave antenna at the second frequency;

amplifying the second signal by using the plurality of transistors;

guiding the second signal through the second MTM transmission line which operates as the second transmission line at the second frequency; and outputting the second signal from an output port.

23. The method for processing signals for FDD based on a CRLH MTM structure as in claim 22, wherein the step of configuring the first MTM transmission line includes steps of:

using a plurality of first CRLH blocks, each comprising at least one first CRLH unit cell; and adjusting first equivalent circuit parameters of each of the at least one first CRLH unit cell to have a first dispersion curve that includes a point in a guided region at the first frequency, and another point in a radiated region at the second frequency, and wherein the step of configuring the second MTM transmission line includes steps of:

using a plurality of second CRLH blocks, each comprising at least one second CRLH unit cell; and adjusting second equivalent circuit parameters of each of the at least one second CRLH unit cell to have a second dispersion curve that includes a point in the radiated region at the first frequency, and another point in the guided region at the second frequency.

24. The method for processing signals for FDD based on a CRLH MTM structure as in claim 23, wherein the step of configuring the first MTM transmission line further includes a step of:

adjusting the first equivalent circuit parameters to balance the first CRLH unit cell and to have the first dispersion curve that includes a point where a propagation constant is substantially zero at the second frequency for generating broadside radiation;

and wherein the step of configuring the second MTM transmission line further includes a step of:

adjusting the second equivalent circuit parameters to balance the second CRLH unit cell and to have the second dispersion curve that includes a point where the propagation constant is substantially zero at the first frequency for generating broadside radiation.

25. The method for processing signals for FDD based on a CRLH MTM structure as in claim 23, wherein the step of adjusting the first equivalent circuit parameters includes a step of:

using a first series right-handed (RH) inductance, a first series left-handed (LH) capacitance, a first shunt LH inductance, and a first shunt RH capacitance, and wherein the step of adjusting the second equivalent circuit parameters includes a step of:

using a second series right-handed (RH) inductance, a second series left-handed (LH) capacitance, a second shunt LH inductance, and a second shunt RH capacitance.

26. The method for processing signals for FDD based on a CRLH MTM structure as in claim 25, wherein the step of adjusting the first equivalent circuit parameters includes adjusting the first series RH inductance, the first series LH capacitance, the first shunt LH inductance, the first shunt RH capacitance, and a number of the first CRLH unit cells in each of the first CRLH blocks to have a phase across each of the first CRLH blocks to be $\phi_1$;

and wherein the step of adjusting the second equivalent circuit parameters includes adjusting the second series RH inductance, the second series LH capacitance, the second shunt LH inductance, the second shunt RH capacitance, and a number of the second CRLH unit cells in each of the second CRLH blocks to have a phase across each of the second CRLH blocks to be $\phi_2$, such that a difference between $\phi_1$ and $\phi_2$ is 360 degrees times an integer.

27. The method for processing signals for FDD based on a CRLH MTM structure as in claim 22, wherein the step of configuring the first MTM transmission line includes using a first zeroth order resonator having an open circuited first end and a second end capacitively coupled to the input port;

wherein the step of configuring the second MTM transmission line includes using a second zeroth order resonator having an open circuit third end and a fourth end capacitively coupled to the output port;

and wherein the step of coupling the plurality of transistors includes capacitively coupling the first terminal of each transistor to the first MTM transmission line and the second terminal of each transistor to the second MTM transmission line.

28. A method for processing signals for time division duplex (TDD) based on a composite right and left handed (CRLH) metamaterial (MTM) structure, comprising steps of:

configuring a first MTM transmission line to be tuned to operate as a first transmission line that guides a signal at a frequency during a first time period and to be tuned to operate as a first leaky wave antenna that receives a signal at the frequency during a second time period;

configuring a second MTM transmission line to be tuned to operate as a second transmission line that guides a signal at the frequency during the second time period and to be tuned to operate as a second leaky wave antenna that transmits a signal at the frequency during the first time period;

coupling a plurality of transistors to the first and second MTM transmission lines by coupling a first terminal of each transistor to the first MTM transmission line and a second terminal of each transistor to the second MTM transmission line;

receiving a first signal at the frequency at an input port during the first time period;

guiding the first signal through the first MTM transmission line which operates as the first transmission line at the frequency;

amplifying the first signal by using the plurality of transistors;

transmitting the first signal through the second MTM transmission line which operates as the second leaky wave antenna at the frequency;

receiving a second signal at the frequency through the first MTM transmission line which operates as the first leaky wave antenna at the frequency during the second time period;

amplifying the second signal by using the plurality of transistors;

guiding the second signal through the second MTM transmission line which operates as the second transmission line at the frequency; and outputting the second signal from an output port.

29. The method for processing signals for TDD based on a CRLH MTM structure as in claim 28, wherein the step of configuring the first MTM transmission line includes using a plurality of first tunable CRLH blocks, each comprising at least one CRLH unit cell; and the step of configuring the second MTM transmission line includes using a plurality of second tunable CRLH blocks, each comprising at least one CRLH unit cell, the method further comprising a step of adjusting equivalent circuit parameters of each of the CRLH unit cells in the first and second MTM transmission lines to have a first state or a second state, the first state corresponding to a first dispersion curve and the second state corresponding to a second dispersion curve, wherein the first dispersion curve includes a point in a guided region at the frequency, and the second dispersion curve includes a point in a radiated region at the frequency.

30. The method for processing signals for TDD based on a CRLH MTM structure as in claim 29, further comprising a step of using a control circuit, wherein the control circuit sends a first control signal to the at least one CRLH unit cell in each of the first tunable CRLH blocks to be tuned to the first state, and a second control signal to the at least one CRLH unit cell in each of the second tunable CRLH blocks to be tuned to the second state during the first time period, and the control circuit sends a third control signal to the at least one CRLH unit cell in each of the first tunable CRLH blocks to be tuned to the second state, and a fourth control signal to the at least one CRLH unit cell in each of the second tunable CRLH blocks to be tuned to the first state during the second time period.

31. The method for processing signals for TDD based on a CRLH MTM structure as in claim 29, wherein the step of adjusting the equivalent circuit parameters of each of the CRLH unit cells includes further adjusting the equivalent circuit parameters to balance the CRLH unit cell and to have the second dispersion curve that includes a point where a propagation constant is substantially zero at the frequency for providing broadside radiation.

32. The method for processing signals for TDD based on a CRLH MTM structure as in claim 29, wherein the step of adjusting the equivalent circuit parameters of each of the CRLH unit cells includes using a series right-handed (RH) inductance, a series left-handed (LH) capacitance, a shunt LH inductance, a shunt RH capacitance, a first varactor in series with the series LH capacitance, and a second varactor in series with the shunt LH inductance, wherein the first and second varactors are used to tune the CRLH unit cell to the first state or to the second state.

33. The method for processing signals for TDD based on a CRLH MTM structure as in claim 32, wherein the step of adjusting the equivalent circuit parameters of each of the CRLH unit cells includes adjusting the equivalent circuit parameters and a number of the CRLH unit cells in each of the first and second tunable CRLH blocks to have a phase across each of the first and second tunable CRLH blocks to be $\phi_1$ for the first state and $\phi_2$ for the second state, such that a difference between $\phi_1$ and $\phi_2$ is 360 degrees times an integer.

34. The method for processing signals for TDD based on a CRLH MTM structure as in claim 28, wherein the step of configuring the first MTM transmission line includes using a first zeroth order resonator having an open circuited first end and a second end capacitively coupled to the input port;

wherein the step of configuring the second MTM transmission line includes using a second zeroth order resonator having an open circuit third end and a fourth end capacitively coupled to the output port;

and wherein the step of coupling the plurality of transistors includes capacitively coupling the first terminal of each transistor to the first MTM transmission line and the second terminal of each transistor to the second MTM transmission line.

35. The method for processing signals for TDD based on a CRLH MTM structure as in claim 29, wherein the step of adjusting the equivalent circuit parameters of each of the CRLH unit cells includes using distributed circuit elements and conductive segments that are formed separately from the distributed circuit elements, and changing an electrical length of each of the distributed circuit elements by coupling and decoupling the conductive segment using a switch to provide different states corresponding to different dispersion curves.

36. A method for processing signals for time division duplex (TDD) based on a composite right and left handed (CRLH) metamaterial (MTM) structure, comprising steps of:

configuring a first MTM transmission line based on a plurality of first CRLH blocks, each first CRLH block comprising at least one first CRLH unit cell, to operate as a first transmission line that guides a signal at a frequency;

configuring a second MTM transmission line based on a plurality of second CRLH blocks, each second CRLH block comprising at least one second CRLH unit cell, to operate as a first leaky wave antenna that receives a signal at the frequency;

configuring a third MTM transmission line based on a plurality of third CRLH blocks, each third CRLH block comprising at least one third CRLH unit cell, to operate as a second leaky wave antenna that transmits a signal at the frequency;

configuring a fourth MTM transmission line based on a plurality of fourth CRLH blocks, each fourth CRLH block comprising at least one fourth CRLH unit cell, to operate as a second transmission line that guides a signal at the frequency;

using a switch to activate the first and third MTM transmission lines during a transmit time period and the second and fourth MTM transmission lines during a receive time period;

coupling a first plurality of transistors to the first and third MTM transmission lines; and coupling a second plurality of transistors to the second and fourth MTM transmission lines;

wherein the first CRLH unit cell is configured to have a first dispersion curve that includes a point in a guided region at the frequency;

the second CRLH unit cell is configured to have a second dispersion curve that includes a point in a radiated region at the frequency;

the third CRLH unit cell is configured to have a third dispersion curve that includes a point in the radiated region at the frequency; and the fourth CRLH unit cell is configured to have a fourth dispersion curve that includes a point in a guided region at the frequency.

37. The method for processing signals for TDD based on a CRLH MTM structure as in claim 36, wherein each of the steps of configuring of the first, second, third, and fourth MTM transmission lines includes using a zeroth order resonator, and capacitively coupling the zeroth order resonator to either the first or the second plurality of transistors.

38. The method for processing signals for TDD based on a CRLH MTM structure as in claim 36, wherein coupling the first plurality of transistors to the first and third MTM transmission lines includes coupling a series of transistors to the first and third MTM transmission lines during the transmit time period; and coupling the second plurality of transistors to the second and fourth MTM transmission lines includes coupling the series of transistors to the second and fourth MTM transmission lines during the receive time period.

39. The method for processing signals for TDD based on a CRLH MTM structure as in claim 29, wherein the step of adjusting the equivalent circuit parameters of each of the CRLH unit cells includes using a series right-handed (RH) inductor, a series varactor, a shunt variable inductor, and a shunt RH capacitor, wherein the series varactor and the shunt variable inductor are used to tune the CRLH unit cell to the first state or to the second state.

40. The method for processing signals for TDD based on a CRLH MTM structure as in claim 29, wherein the step of adjusting the equivalent circuit parameters of each of the CRLH unit cells includes using a series right-handed (RH) inductor, a series varactor, a shunt gyrator, and a shunt RH capacitor, wherein the series varactor and the shunt gyrator are used to tune the CRLH unit cell to the first state or to the second state.

41. An antenna system based on a composite right and left handed (CRLH) metamaterial (MTM) structure, comprising:

a first MTM line comprising a plurality of first CRLH blocks, each first CRLH block comprising at least one first CRLH unit cell structured to guide signals within a selected signal frequency region so that the first MTM line operates as a transmission line to guide a signal at a signal frequency in the selected signal frequency region along the first MTM line;

a second MTM line comprising a plurality of second CRLH blocks, each second CRLH block comprising at least one second CRLH unit cell structured to wirelessly transmit or receive signals within the selected signal frequency region so that the second MTM line operates as a leaky wave antenna that wirelessly transmits or receives the signal at the signal frequency; and a plurality of transistors coupled to the first and second MTM lines, each transistor having a first terminal coupled to the first MTM line and a second terminal coupled to the second MTM line to amplify the signal that is guided by the first MTM line.

42. The system as in claim 41, comprising:

a signal input port coupled to the first MTM line to direct the signal into the first MTM line to cause the signal to be amplified by the transistors and transmitted by the second MTM line as a wireless signal.

43. The system as in claim 41, comprising:

a signal output port coupled to the first MTM line to direct energy guided by the first MTM line as an output signal of a wireless signal in the selected signal frequency region that is first received by the second MTM line and then amplified by the transistors.

44. The system as in claim 41, wherein:

the first CRLH unit cell in the first MTM line radiates signals within a second, different selected signal frequency region so that the first MTM line operates as a leaky wave antenna that wirelessly radiates or receives a wireless signal in the second, different selected signal frequency region; and the second CRLH unit cell in the second MTM line guides signals within the second selected signal frequency region so that the second MTM line operates as a transmission line to guide a signal in the second, different selected signal frequency region along the second MTM line.

* * * * *